United States Patent
Nakata

(10) Patent No.: US 12,035,058 B2
(45) Date of Patent: Jul. 9, 2024

(54) ELECTRONIC EQUIPMENT

(71) Applicant: Sony Semiconductor Solutions Corporation, Kanagawa (JP)

(72) Inventor: Masashi Nakata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 170 days.

(21) Appl. No.: 17/790,021

(22) PCT Filed: Jan. 15, 2021

(86) PCT No.: PCT/JP2021/001329
§ 371 (c)(1),
(2) Date: Jun. 29, 2022

(87) PCT Pub. No.: WO2021/157324
PCT Pub. Date: Aug. 12, 2021

(65) Prior Publication Data
US 2023/0030068 A1 Feb. 2, 2023

(30) Foreign Application Priority Data

Feb. 3, 2020 (JP) .................. 2020-016524

(51) Int. Cl.
*H04N 25/63* (2023.01)
*H01L 27/146* (2006.01)
(Continued)

(52) U.S. Cl.
CPC ....... *H04N 25/63* (2023.01); *H01L 27/14621* (2013.01); *H01L 27/14627* (2013.01);
(Continued)

(58) Field of Classification Search
CPC ........ H04N 25/63; H04N 25/61; H04N 25/13; H04N 25/79; H04N 25/11; H04N 23/54;
(Continued)

(56) References Cited

U.S. PATENT DOCUMENTS 9,057,931 B1  6/2015 Baldwin
9,749,562 B2 * 8/2017 Goto .................. G02B 27/0093
(Continued)

FOREIGN PATENT DOCUMENTS

| CN | 108848317 A | 11/2018 |
| EP | 4044574 A | 8/2022 |
| JP | 2000298253 A | 10/2000 |
| JP | 2004147046 A | 5/2004 |
| JP | 2013126180 A | 6/2013 |
| JP | 2013211413 A | 10/2013 |
| JP | 2017181797 A | 10/2017 |

OTHER PUBLICATIONS

International Search Report (PCT/ISA/210), International Application No. PCT/JP2021/001329, dated Apr. 6, 2021.

*Primary Examiner* — Kelly L Jerabek
(74) *Attorney, Agent, or Firm* — Michael Best & Friedrich LLP

(57) ABSTRACT

To suppress image quality degradation due to artifacts. Electronic equipment includes a display unit, an imaging unit disposed on a side opposite to a display surface of the display unit, and a signal processing unit. The imaging unit includes a plurality of on-chip lenses and a plurality of pixels, in which the on-chip lens includes a first on-chip lens, the plurality of pixels includes a first pixel, the first pixel is disposed to overlap the first on-chip lens, and the first pixel includes a plurality of photoelectric conversion units. The signal processing unit processes signals output from the plurality of pixels.

17 Claims, 18 Drawing Sheets

(51) Int. Cl.
*H04N 23/54* (2023.01)
*H04N 23/55* (2023.01)
*H04N 25/61* (2023.01)

(52) U.S. Cl.
CPC ............. *H04N 23/54* (2023.01); *H04N 23/55* (2023.01); *H04N 25/61* (2023.01)

(58) Field of Classification Search
CPC ........ H04N 23/55; H04N 23/57; H04N 23/81; H01L 27/14645; H01L 27/14627; H01L 27/14621
See application file for complete search history.

(56) References Cited

U.S. PATENT DOCUMENTS

| | | | |
|---|---|---|---|
| 2010/0066800 A1* | 3/2010 | Ryf | ........................ H04N 7/144 348/340 |
| 2014/0022439 A1 | 1/2014 | Aoki | |
| 2018/0198980 A1* | 7/2018 | Takagi | ................. H04N 13/204 |
| 2021/0175270 A1* | 6/2021 | Pang | ................. H01L 27/14605 |
| 2021/0193728 A1* | 6/2021 | Kim | ..................... H04N 25/778 |

* cited by examiner

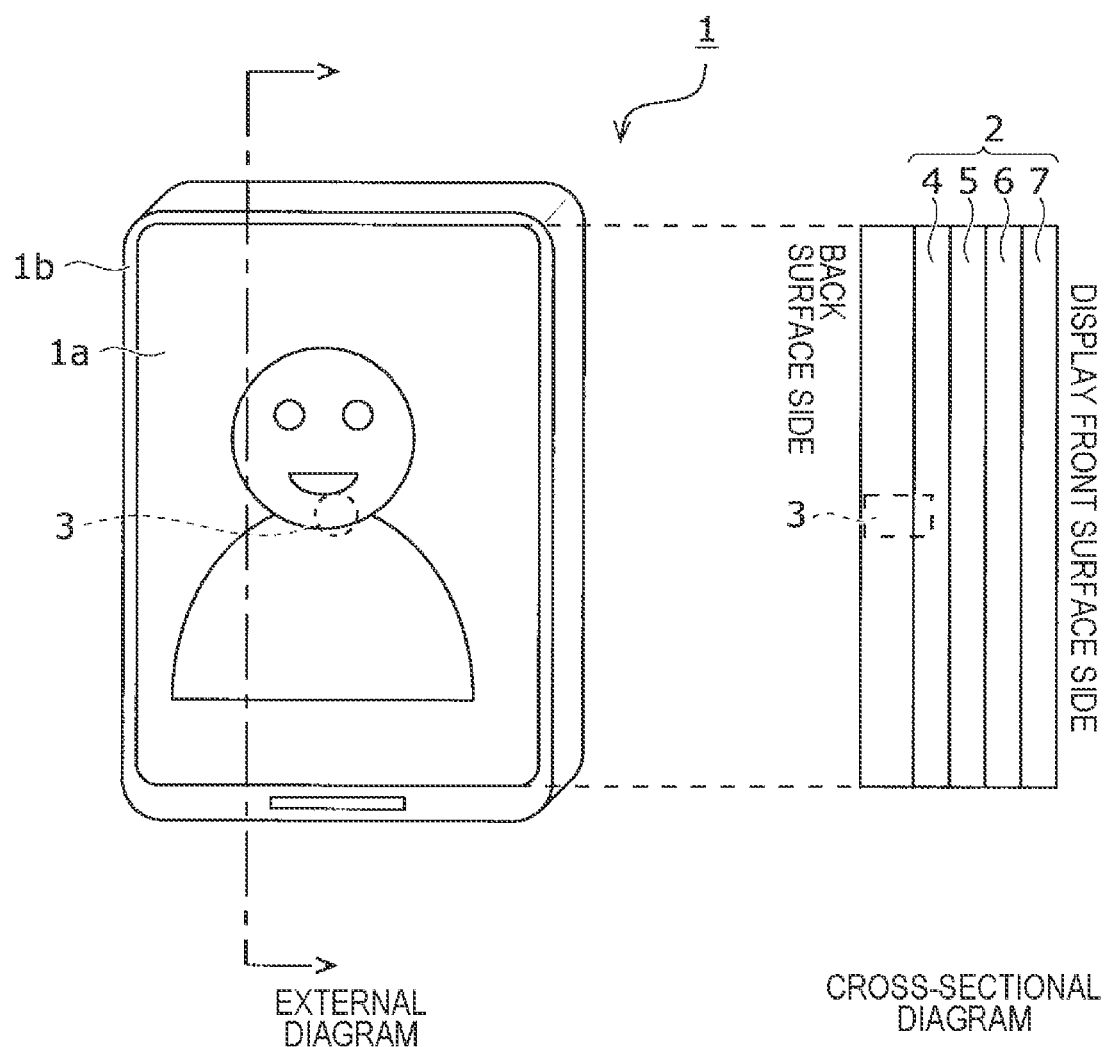

FIG. 7
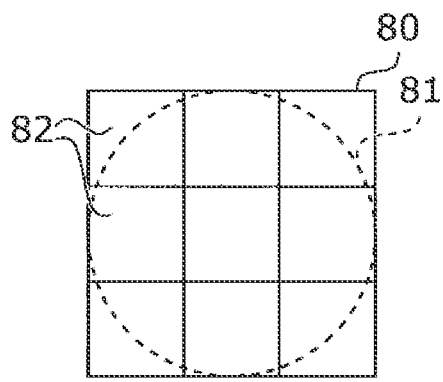
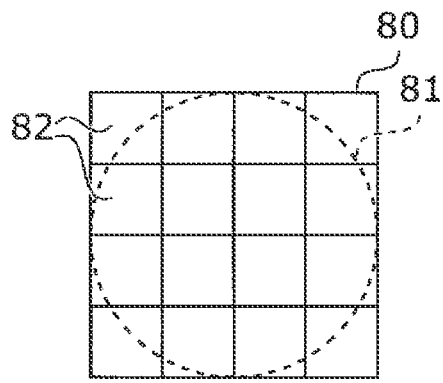
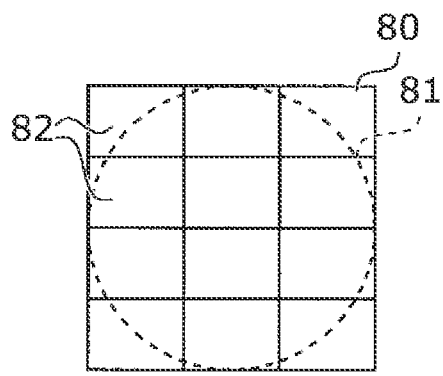

FIG. 15
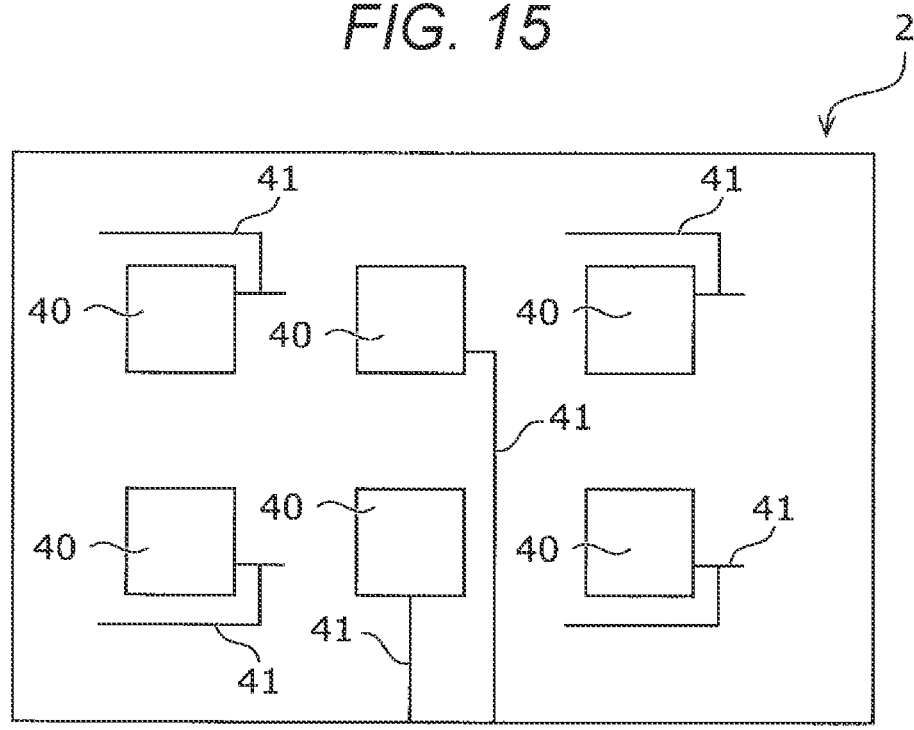
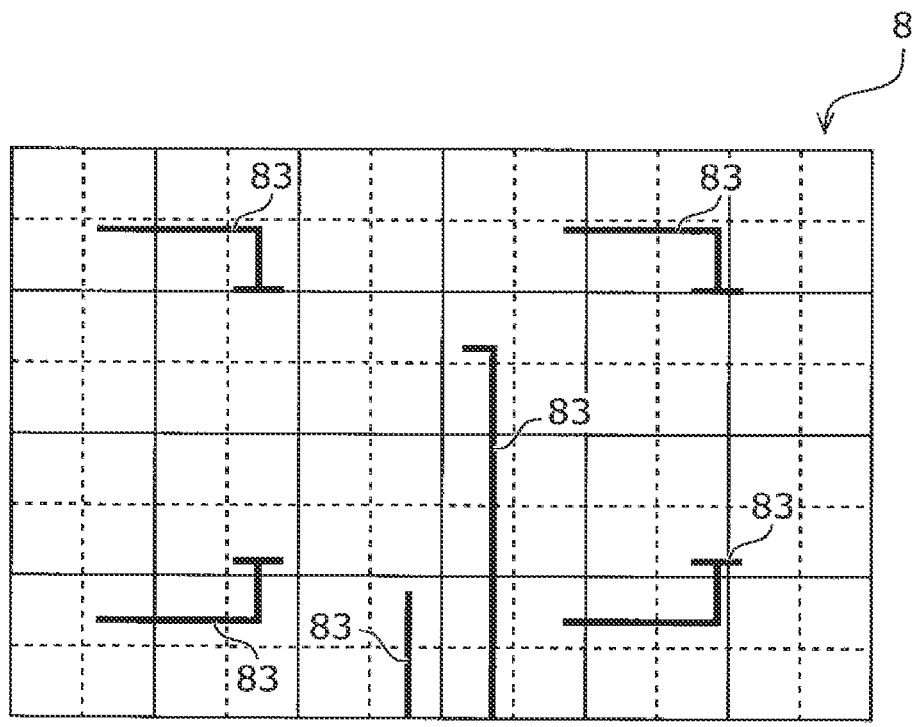

ELECTRONIC EQUIPMENT

TECHNICAL FIELD

The present disclosure relates to electronic equipment.

BACKGROUND ART

In recent electronic equipment such as a smartphone, a mobile phone, and a personal computer (PC), a camera is mounted in a frame (bezel) of a display unit so that video calling and moving image imaging can be easily performed. Since smartphones and mobile phones are often carried in pockets or bags, it is necessary to make the outer size as compact as possible. On the other hand, when the size of the display screen is small, as the display resolution is higher, the displayed character size becomes smaller, and it is difficult to visually recognize the character. For this reason, it has been studied to increase the size of the display screen as much as possible without increasing the outer size of the electronic equipment by reducing the bezel width around the display screen.

However, since a camera or the like is often mounted on the bezel of electronic equipment, the bezel width cannot be made smaller than the outer diameter size of the camera. Furthermore, in a case where the camera is disposed in the bezel, for example, when a conversation is held in video calling, the eye line is often placed in the vicinity of the center of the display screen, and thus, the eye line deviates from the optical axis of the camera, and an imaged image with a sense of discomfort that the eye lines do not meet is obtained. In order to avoid the above-described problem, it has been proposed that a camera module is disposed on a side opposite to a display surface of a display unit, and subject light having passed through the display unit is imaged with a camera.

CITATION LIST

Patent Document

Patent Document 1: Japanese Patent Application. Laid-Open No. 2013-211413

SUMMARY OF THE INVENTION

Problems to be Solved by the Invention

However, since part of the light passing through the display unit is incident on the camera by being reflected or diffracted, there is a problem that the image quality of the imaged image is deteriorated due to artifacts due to the influence of flare due to reflection or diffraction or the influence of wiring or the like disposed in an upper portion (display surface side of the display) of the camera.

One aspect of the present disclosure provides electronic equipment capable of suppressing image quality degradation due to artifacts.

Solutions to Problems

According to one mode, electronic equipment includes a display unit, an imaging unit disposed on a side opposite to a display surface of the display unit, and a signal processing unit. The imaging unit includes a plurality of on-chip lenses and a plurality of pixels, in which the on-chip lens includes a first on-chip lens, the plurality of pixels includes a first pixel, the first pixel is disposed to overlap the first on-chip lens, and the first pixel includes a plurality of photoelectric conversion units. The signal processing unit processes signals output from the plurality of pixels.

The first pixel may acquire information of a predetermined color. For example, each pixel acquires predetermined color information on the basis of color disposition in a Bayer array or the like.

The first pixel may include a color filter.

The first pixel may include an organic photoelectric conversion film in which each photoelectric conversion unit belonging to the same first pixel receives light of the same color. As described above, specific color information may be extracted using the filter or the organic photoelectric conversion film.

The pixel may include m×n (m and n are each an integer of two or more; photoelectric conversion units. For example, each pixel may include 2×2 photoelectric conversion units, 3×3 photoelectric conversion units, 4×4 photoelectric conversion units, or 2×3 photoelectric conversion units, or the like.

The photoelectric conversion unit includes a photoelectric conversion element.

The photoelectric conversion element may be a photodiode.

The imaging unit may have a plurality of first pixels colored by a Bayer array.

The lens may be an on-chip lens. Furthermore, an on-chip microlens may be provided.

An optical system different from the lens may be provided between the display unit and the imaging unit.

The optical system may be a microlens array.

The signal processing unit may add output values of the photoelectric conversion units belonging to the same first pixel to obtain the output value of the pixel.

The signal processing unit may correct the output. value of the first pixel in a case where the output values from the respective photoelectric conversion units exceed a predetermined difference or a predetermined ratio in the photoelectric conversion units formed in the same first pixel.

The predetermined difference or the predetermined ratio may be decided on the basis of at least one of an individual difference of the photoelectric conversion units, a phase difference depending on the positions of the photoelectric conversion units, or noise generated in the photoelectric conversion units.

The signal processing unit may calculate the output value of the first pixel using a pixel having a low output value of the photoelectric conversion units in the first pixel.

The signal processing unit may correct the output value of the first pixel by using the output value of the first pixel that acquires the output value of the same color around the first pixel.

The signal processing unit may perform correction in the first pixel in a case where a subject having predetermined brightness or more is included.

The signal processing unit may acquire flare-corrected image data from the acquired signal.

The signal processing unit may determine that flare occurs in the imaged image.

A plurality of imaging units may exist at different positions on the display surface, and the signal processing unit may perform correction for pixels belonging to the region determined to have flare on the basis of outputs of corresponding pixel regions of the imaging units existing at the different positions.

The signal processing unit may perform correction for pixels belonging to the region determined to have flare on the basis of a learned model.

For the acquired first pixel, the signal processing unit may perform correction on the basis of at least one of an average value of outputs of the plurality of photoelectric conversion units belonging to the first pixel, a value having low sensitivity among outputs of the photoelectric conversion units belonging to the first pixel, or a value obtained by inputting outputs of the plurality of photoelectric conversion units belonging to the first pixel to a learned model.

The signal processing unit may perform correction using the photoelectric conversion units for the first pixel on the basis of a circuit of the display unit or an optical system.

In a case where the correction based on the circuit of the display unit or the optical system is performed for the first pixel, the signal processing unit may perform noise removal different from that of another first pixel.

The display unit may be provided on both surfaces of a device.

BRIEF DESCRIPTION OF DRAWINGS

FIG. 2 is a schematic external diagram and a cross-sectional diagram of electronic equipment according to an embodiment.

FIG. 7 is a diagram schematically illustrating imaging pixels according to an embodiment.

FIG. 15 is a diagram illustrating a state of image deterioration of an imaging unit due to wiring of a display unit.

MODE FOR CARRYING OUT THE INVENTION

Embodiments of electronic equipment are described below with reference to the drawings. Although main components of the electronic equipment will be mainly described below, the electronic equipment may have components and functions that are not illustrated or described. The description described below does not exclude components or functions that are not illustrated or described. Furthermore, there are cases where the size, shape, aspect ratio, and the like are changed for the sake of description, but these have an appropriate size, shape, aspect ratio, and the like in mounting.

Note that, in the description described below, a signal to be acquired is described as image information or imaging information, but the image information and the imaging .information are concepts in a broad sense, and are concepts including an image of one frame in a still image, a moving image, or a video. Furthermore, "larger" and "smaller" may be read as "equal to or more" and "equal to or less than", respectively.

First Embodiment

Figure 1:
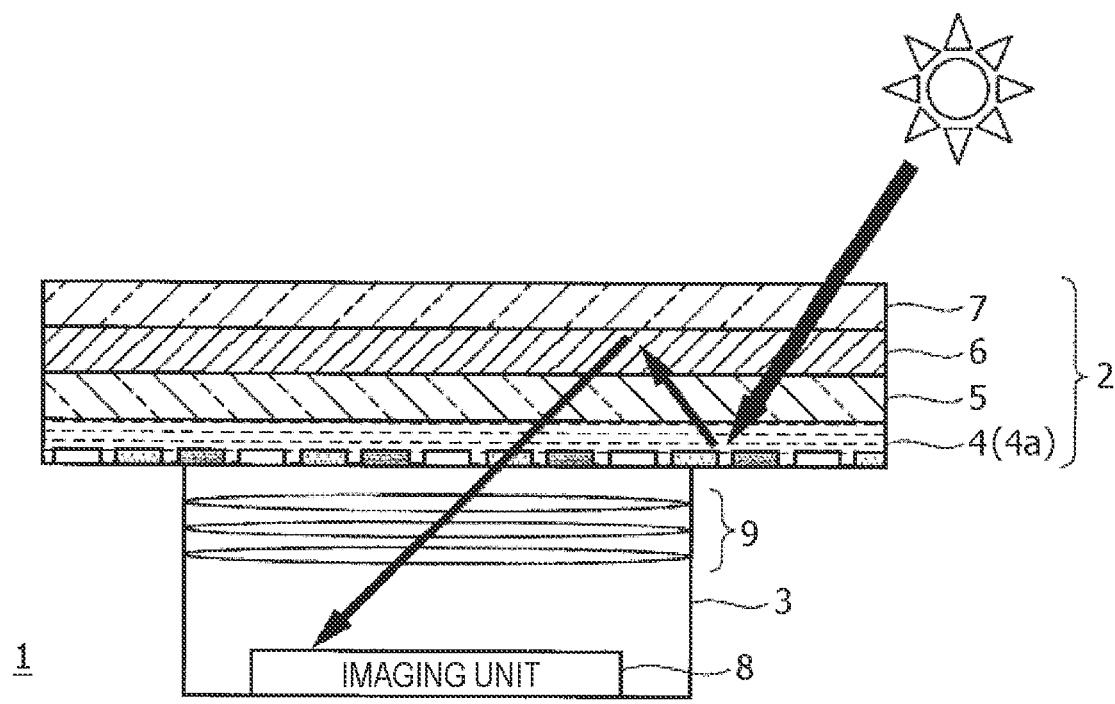
FIG. 1 is a schematic cross-sectional diagram of electronic equipment according to an embodiment.

FIG. 1 is a schematic cross-sectional diagram of electronic equipment according to the first embodiment. Electronic equipment 1 in FIG. 1 is an arbitrary device having a display function and an imaging function, for example a smartphone, a mobile phone, a tablet, a personal computer, or the like. The electronic equipment 1 includes a display unit 2 and a camera module 3. The camera module 3 is disposed on the back side of the display surface of the display unit 2. That is, the camera module 3 performs imaging through the display unit 2. Hereinafter, in the description of the embodiment, the camera module 3 may be described as being below the display.

FIG. 2 is a schematic external diagram and a cross-sectional diagram of the electronic equipment 1 of FIG. 1. In the example of FIG. 2, a display screen 1a expands to be close to the outer size of the electronic equipment 1, and the width of a bezel 1b around the display screen 1acan be set to, for example, several millimeters or less. Normally, a front camera is often mounted in the bezel 1b, but as indicated by the broken line in FIG. 2, the camera module 3 functioning as the front camera is disposed on the back surface side in the display screen 1a. As described above, by providing the front camera on the back surface side of the display screen 1a, it is not necessary to dispose the front camera in the bezel 1b, and the width of the bezel 1b can be narrowed.

Note that, in FIG. 2, the camera module 3 is disposed on the back surface side of substantially the center of the display screen 1a, but it is sufficient if the camera module 3 is disposed on the back surface side of the display screen 1a. For example, the camera module 3 may be disposed on the back surface side in the vicinity of a peripheral edge portion of the display screen 1a, or may be disposed on the back surface side below the center of the display screen 1a in FIG. 2 in the case of being used for fingerprint authentication or the like. As described above, in the present embodiment, the camera module 3 may be disposed at an arbitrary position overlapping the display screen 1a. Note that, unless otherwise specified, "overlapping" in the present disclosure means, for example, having a common region in the horizontal direction in FIG. 1 or having a common existence region in the horizontal direction and being disposed at a position displaced in the vertical direction. As an example, in a case where the display surface of the display unit 2 is above and an imaging unit 8 is below, it means a state of being displaced in an up-down direction and not being displaced in a left-right direction.

In FIG. 2, the display unit 2 and the camera module 3 are provided on one surface of the device, but it is not limited thereto. For example, the display unit 2 and the camera module 3 may be provided on both surfaces of the device.

As illustrated in FIG. 1, the display unit 2 is a structural body in which a display panel 4, a circularly polarizing plate 5, a touch panel 6, and cover glass 7 are stacked in this order as a display optical system. Note that the arrangement of them is not limited to the above, and they may be appropriately interchanged or two or more of the same configurations may exist.

The display panel 4 may include, for example, an organic light emitting diode (OLFD), a liquid crystal, a micro LED, or an element based on another display principle. The display panel 4 such as an OLED includes a plurality of layers. A member having a low transmittance such as a color filter layer or the like is often disposed in the display panel 4. As described later, a through-hole may be formed in the member having a low transmittance in the display panel 4 in accordance with the place of disposition of the camera module 3. When the subject light passing through the through-hole is made incident on the camera module 3, the image quality of the image imaged by the camera module 3 can be improved.

The circularly polarizing plate 5 is provided to reduce glare, enhance visibility of the display screen 1a even in a bright environment, or the like. A touch sensor is incorporated in the touch panel 6. There are various types of touch sensors such as a capacitive type, a resistive film type, and a pressure-sensitive type, but any type may be used. Furthermore, the touch panel 6 and the display panel 4 may be integrated. The cover glass 7 is provided to protect the display panel 4 and the like.

The camera module 3 includes the imaging unit 8 and an optical system 9. The optical system 9 is disposed on the light incident surface side of the imaging unit 8, that is, on the side close to the display unit 2, and condenses the light passing through the display unit 2 on the imaging unit 8. The optical system 9 may include one or a plurality of lenses.

The imaging unit 8 includes a plurality of photoelectric conversion units. A lens is disposed in each photoelectric conversion unit. This lens causes the photoelectric conversion unit constituting each pixel to receive light appropriately emitted to the imaging unit 8 by the optical system 9. The photoelectric conversion unit photoelectrically converts the light incident through the display unit 2. The photoelectric conversion unit may be a complementary metal oxide semiconductor (CMOS) sensor or a charge coupled device (CCD) sensor. Furthermore, the photoelectric conversion unit may include a photodiode or an organic photoelectric conversion film. The plurality of photoelectric conversion units can be arrayed in any manner. The method for arraying the plurality of photoelectric conversion units may be, for example, a Bayer array, an interline array, a checkered array, a stripe array, or another array.

In the present disclosure, an output value of the photoelectric conversion unit or a value subjected to predetermined conversion on the basis of the output value is referred to as a pixel value.

Figure 3A:
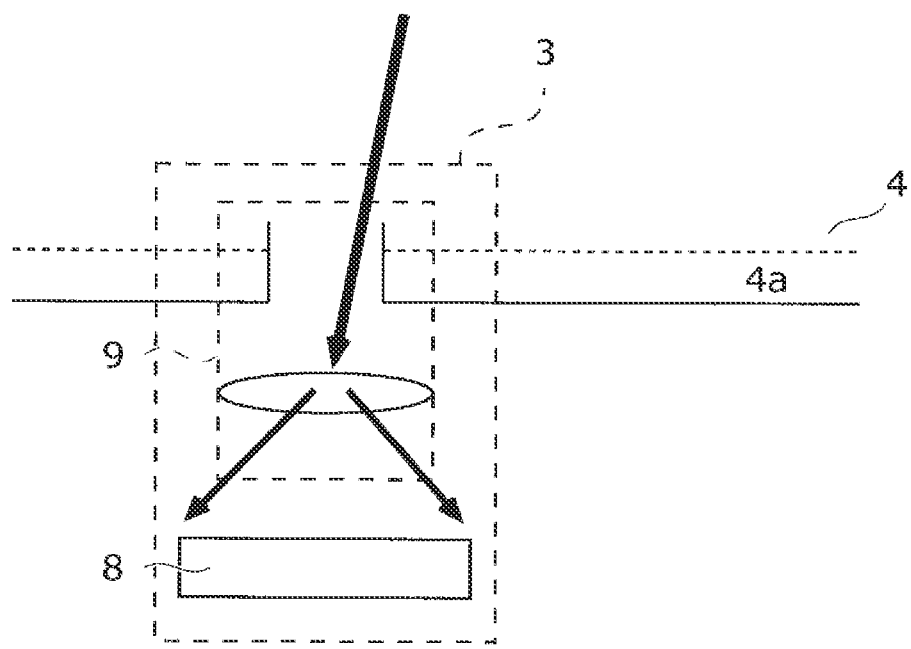
FIG. 3A is a schematic cross-sectional diagram of electronic equipment according to an embodiment.

FIG. 3A is a diagram describing a relationship between the camera module 3 and the display panel 4 in FIG. 1 in more detail. It is a diagram illustrating an example of the camera module 3. The camera module 3 includes, for example, the imaging unit 8 and the optical system 9. The optical system 9 is disposed on the light incident surface side of the imaging unit 8, that is, on the side close to the display unit 2. The light transmitted through the display surface of the display unit 2 is propagated to the imaging unit 8 by the optical system 9.

The imaging unit 8 includes, for example, a light receiving element and a photoelectric conversion element such as a photodiode or the like. The light condensed, refracted, diffused, or the like, and propagated by the optical system 9 is received by the photoelectric conversion units included in the imaging unit 8 and outputs an analog signal. The photoelectric conversion unit may include, for example, a color filter such as of a Bayer array, on the incident surface side of each imaging element, or may include a stacked color filter. Furthermore, an organic photoelectric conversion film may be provided instead of the color filter. In addition, those that can be substituted for a filter for acquiring a color image may be provided. Furthermore, although not illustrated, an element, a circuit, and the like necessary for receiving light and outputting an analog signal are provided. Moreover, a polarizing element or the like may be provided.

The optical system 9 may have a concept including, an aperture provided in the display panel 4, which is the through-hole in the member having a low transmittance described above. For example, as the optical system 9, the aperture provided in the display panel 4 and the lens at a position closer to the imaging unit 8 than the aperture are disposed. For example, the aperture may be provided in a substrate 4a having a low transmittance, and a lens that propagates the light transmitted through the aperture portion to the imaging unit 8 may be provided. For example, optical characteristics such as numerical aperture (Na) and f-number in each camera module 3 are defined by the lens and the aperture. Furthermore, moreover, the optical system 9 may cause the camera module 3 to have other optical characteristics such as different Abbe numbers.

Figure 3B:
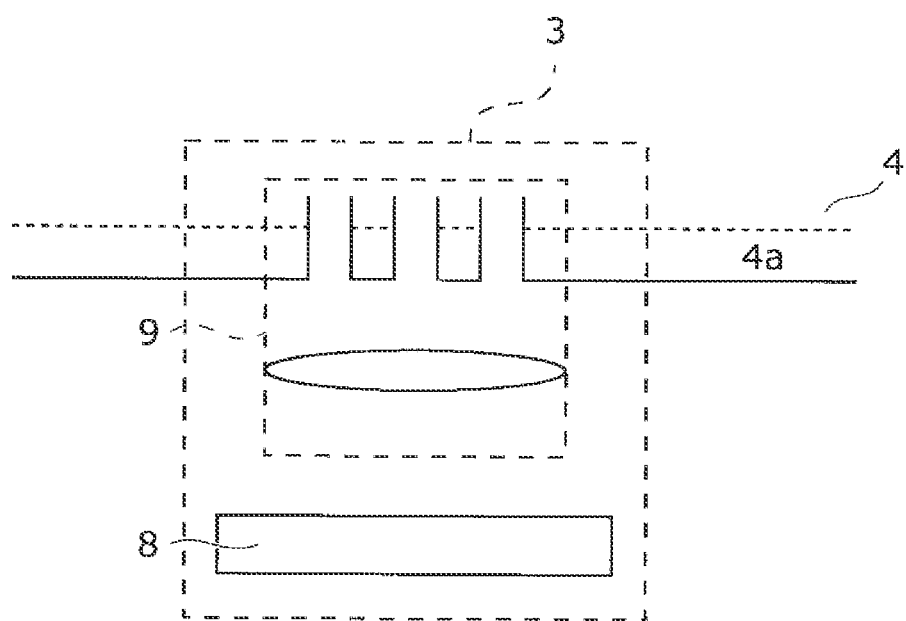
FIG. 3B is a schematic cross-sectional diagram of electronic equipment according to an embodiment.

Note that the aperture and the lens are illustrated as an example, and the configuration of the optical system 9 is not necessarily limited to such combination. Furthermore, in the drawing, one or a plurality of lenses is provided for one aperture, but it is not limited thereto. For example, as illustrated in FIG. 3B, a plurality of apertures may be provided for one lens in the optical system 9. In the region where the aperture does not exist, for example, light emitting elements of the display panel 4 may be provided, and the aperture may. be provided between the light emitting elements. With this disposition, the camera module 3 can be provided without skewing the display.

As described above, the plurality of camera modules 3 may be formed with different optical characteristics depending on the shape of the aperture, the performance of the lens, and the like. In a case where there are two or more camera modules 3, the optical systems 9 corresponding to the two or more camera modules 3 may have different optical characteristics. As another example, the camera module 3 may be divided into a plurality of groups, and each group may have different optical characteristics. For example, the optical system 9 may be provided by being changed in the shape and direction of the aperture, the material of the lens, or the like so that two camera modules 3 having common optical characteristics and one camera module 3 having different optical characteristics are provided.

As indicated by the arrows in FIG. 3A, the light incident from the display surface side of the display unit 2 is refracted or the like by the optical system 9, and is received by the imaging unit 8. In a portion where the optical system 9 is not provided, reflection and the like may be appropriately suppressed, and display on the display unit 2 may be adjusted to be easily viewable, similarly to a normal display. For example, the aperture is provided between light emitting pixels of the display panel 4, a lens is provided on a side opposite to the display surface in the aperture, and the light incident from the display surface side is emitted to the imaging unit 8. Furthermore, the aperture may be provided between each of consecutive light emitting pixels. In other words, the light emitting pixels may be configured to be provided between the aperture and the aperture.

Here, an example of an imaging function of the electronic equipment 1 will be described.

Figure 4:
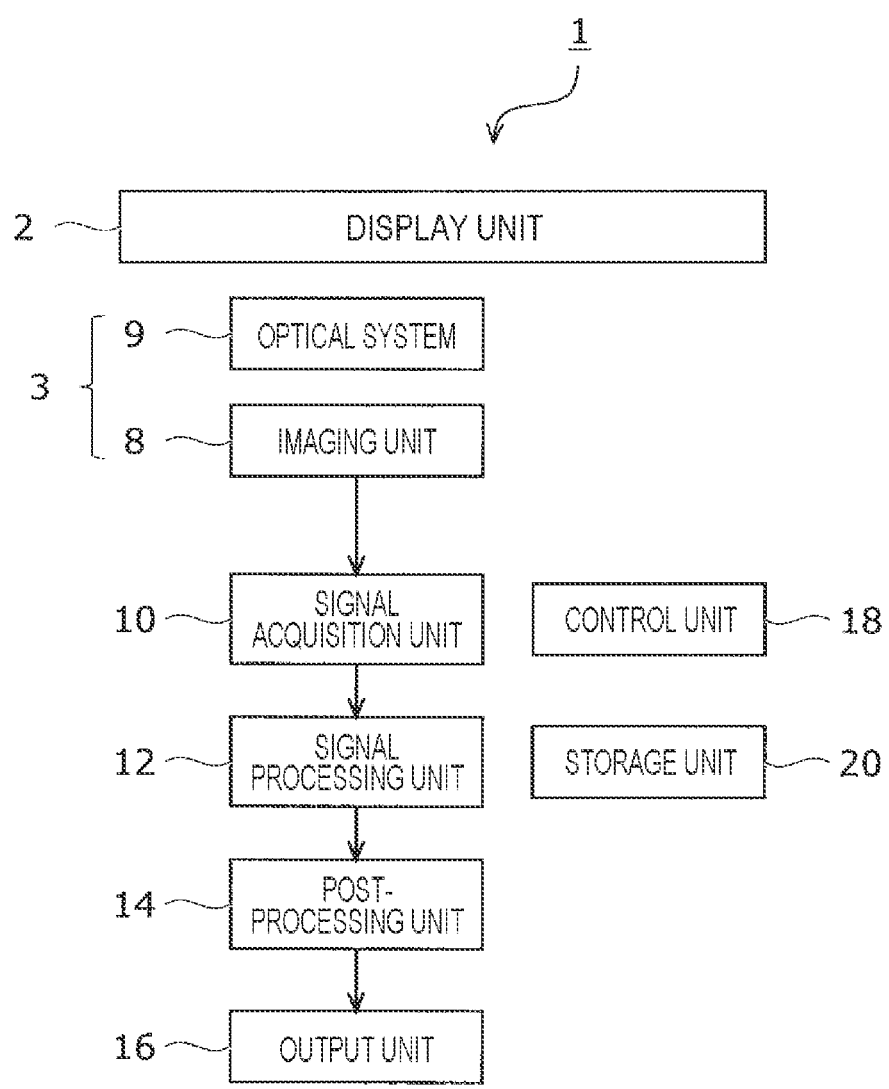
FIG. 4 is a block diagram schematically illustrating electronic equipment according to an embodiment.

FIG. 4 illustrates an example of a block diagram indicating a configuration related to an imaging operation of the electronic equipment 1 according to the present embodiment. The electronic equipment 1 includes the display unit 2, the plurality of camera modules 3, a signal acquisition unit 10, a signal processing unit 12, a post-processing unit 14, an output unit 16, a control unit 18, and a storage unit 20.

Similarly to the drawings described above, the camera modules 3 are provided on the side opposite to the display surface of the display unit 2. The plurality of camera modules 3 may be provided on the display surface of one display unit 2. Each camera module 3 includes the imaging unit 8 and the optical system 9.

The signal acquisition unit 10 is a circuit that processes an analog signal output from the imaging unit 8. The signal acquisition unit 10 includes, for example, an analog to digital converter (ADC), and converts an input analog signal into digital image data.

The signal processing unit 12 acquires an imaged image from the digital image data obtained by conversion by the signal acquisition unit 10. An imaging result is acquired on the basis of the digital image data acquired from the camera module 3. More specifically, for example, the signal processing unit 12 acquires an imaging result in which artifacts such as flare occurring in the camera module 3 are suppressed using the obtained image data by signal processing.

The post-processing unit 14 performs appropriate processing on the imaging result output by the signal processing unit 12 and outputs the processed imaging result. The appropriate processing may be, for example, image processing or signal processing such as pixel defect correction, edge enhancement, noise removal, brightness adjustment, color correction, white balance adjustment, distortion correction, autofocus processing, and the like. Furthermore, this appropriate processing may be processing designated by the user. Furthermore, the post-processing unit 14 does not need to be provided independently, and for example, the signal processing unit 12 may execute the processing up to the post-processing described above.

The output unit 16 outputs information to the outside of the electronic equipment 1. The output unit 16 includes, for example, an output interface. The output interface may be, for example, an interface that outputs a digital signal, such as a universal serial bus (USB) or the like, or a user interface such as a display or the like. Furthermore, the output interface provided in the output unit 16 may also serve as an input interface. Furthermore, the output unit 16 may store data in the storage unit 20 provided inside, and as described above, the output may include a broad meaning.

The control unit 18 controls the processing of the electronic equipment 1. The control unit 18 may include, for example, a central processing unit (CPU), and may control the processing of the signal acquisition unit 10, the signal processing unit 12, the post-processing unit 14, and the output unit 16. Furthermore, control to perform imaging by the camera module 3 may also be executed on the basis of an imaging timing instructed from the user interface.

The storage unit 20 stores data of the electronic equipment 1. The storage unit 20 may be, for example, memory such as dynamic random access memory (DRAM) or a storage such as a solid state drive (SSD). The storage unit 20 may be built-in memory or memory such as a removable memory card. Furthermore, the storage unit 20 is not necessarily provided inside the electronic equipment 1, but may be an external storage or the like connected via an input/output interface. Information is appropriately input into and output from the storage unit 20 at a timing necessary for the electronic equipment 1.

Some or all of those described above may be formed on the same substrate. For example, the camera module 3, the signal acquisition unit 10, the signal processing unit 12, the post-processing unit 14, the output unit 16, the control unit 18, and the storage unit 20 may be formed on one chip, or some of them may be formed as another chip as appropriate. Furthermore, a part of the configuration formed on the same substrate of one chip and a part of the configuration formed on another substrate may be formed to be stacked by technologies such as chip on chip (CoC), chip on wafer (CoW), wafer on wafer (WoW), and the like in the manufacturing process.

Next, a configuration of the imaging unit 8 will be described. As an example, the Bayer array will be described, but, as described above, the color disposition is not limited to the Bayer array, but may be another array as long as the color information can be appropriately acquired. For example, it may be a Bayer array based on a series of RGB or a Bayer array based on a complementary color system of CMY. The state where RGB and CMY are mixed may be possible. Furthermore, the description will be given assuming that the shape of the pixel is a square, but it is not limited thereto. For example, the shape may be a rectangular other than a square or may be a honeycomb structure having a hexagonal shape.

Figure 5:
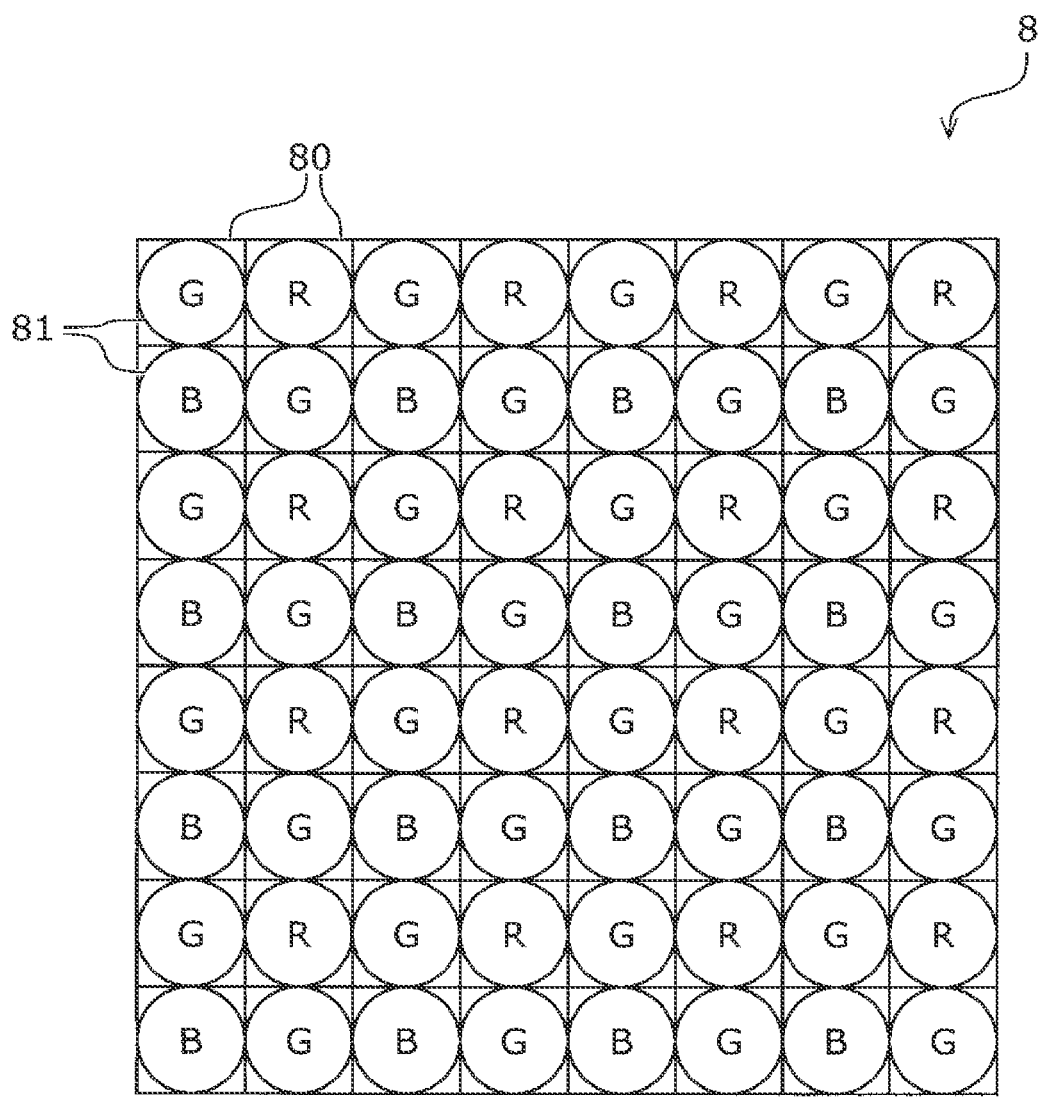
FIG. 5 is a diagram schematically illustrating an imaging unit according to an embodiment.

FIG. 5 is a diagram schematically illustrating color information acquired by each imaging element of the imaging unit 8. FIG. 5 illustrates a state of 8×8 imaging elements included in the imaging unit 8 as an example. Of course, the number of imaging elements is not 8×8, but an appropriate number is provided on the basis of the number of pixels desired to be acquired, the area in which the imaging elements can be disposed, and the like.

The imaging unit 8 includes imaging pixels 80. As illustrated in the drawing, the imaging pixels 80 are provided in an array in the imaging unit 8. The imaging pixel 80 includes a photoelectric conversion element on a side opposite to the display surface of the display unit 2, and includes a lens thereabove. RGB described inside the imaging pixels 80 represent colors, respectively indicating R.: red, G: green, and B: blue. As described above, the color-coding method may be a color filter provided on the display surface side of the photoelectric conversion element, or may be a photoelectric conversion element including an organic photoelectric conversion film.

Each of the imaging pixels 80 includes a lens 81. The lens 81 is, for example, an on-chip lens, and in particular, may be an on-chip micro ens. As described above, by providing the lens for each pixel, the accuracy of the received light intensity, color reproducibility, and the like can be enhanced. The lens 81 may include, for example, Si, but may include another appropriate material. Furthermore, One imaging pixel 80 includes a plurality of divided pixels 82. For example, each imaging pixel 80 in FIG. 5 includes 2×2 divided pixels 82. As described above, by providing a plurality of divided pixels in one pixel, it is possible to expand a dynamic range between pixels as an example of an effect. In the present disclosure, moreover, these divided pixels 82 are also used to remove artifacts. As illustrated in the drawing as an example, the imaging pixel 80 includes a plurality of divided pixels 82, and each imaging pixel 80 and the lens 81 are disposed to overlap each other in a one-to-one correspondence.

Figure 6:
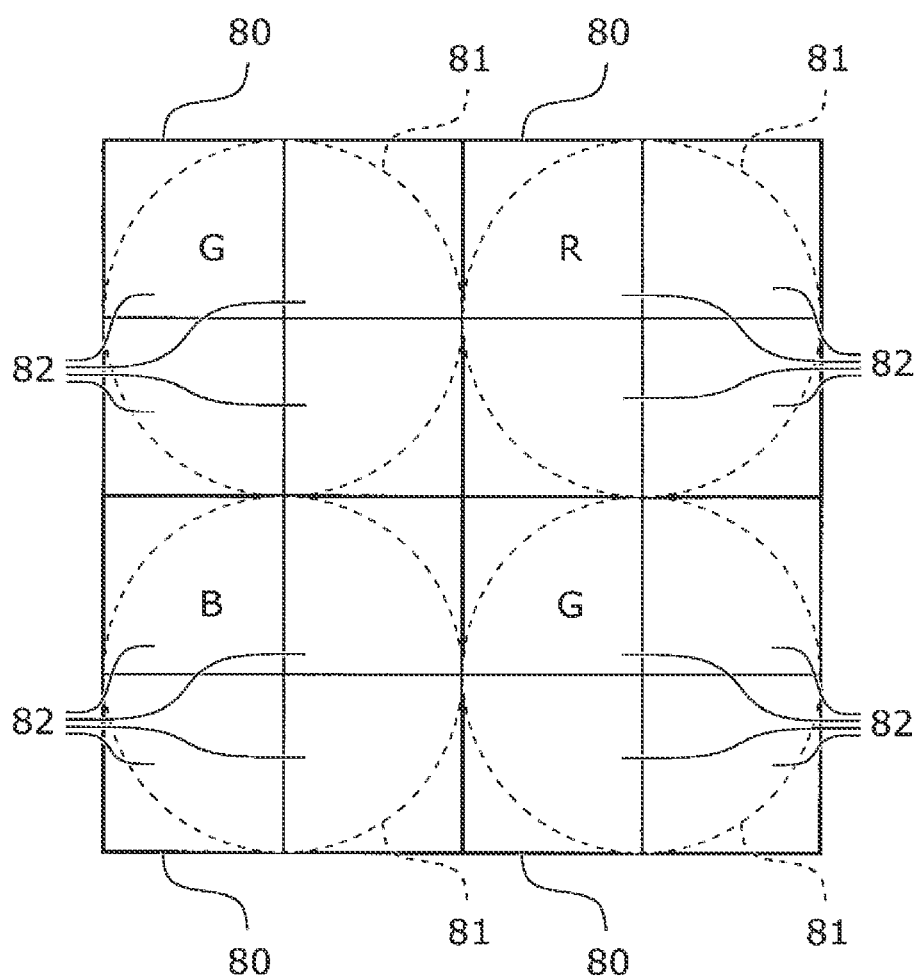
FIG. 6 is a diagram schematically illustrating imaging pixels according to an embodiment.

FIG. 6 is a diagram in which one set of imaging pixels 80 in a Bayer array is extracted. As illustrated. in FIG. 6, for example, the imaging pixel 80 includes 2×2, four divided pixels 82. Each divided pixel 82 is formed to include a photoelectric conversion element. This photoelectric conversion element may be a photodiode. The signal acquisition unit 10 of FIG. 1 acquires analog signals output from these divided pixels 82 including the photoelectric conversion elements. Then, the signal processing unit 12 executes signal processing on the output from the signal acquisition unit 10.

For example, the pixel values of the imaging pixels 80 are calculated by adding the output values acquired by the signal acquisition unit 10 from the divided pixels 82 included in the respective imaging pixels 80. This addition may be executed in the state of an analog signal or may be executed after conversion into a digital signal.

As an example, the signal acquisition unit 10 acquires analog signals from the respective divided pixels 82, and converts the analog signals into digital signals. The signal processing unit 12 corrects the digital signal for each of the divided pixels 82 output from the signal acquisition unit 10 as necessary and then adds the digital signals to acquire a pixel value of the imaging pixel 80.

Such pixel division is used in a general digital camera or the like to expand a dynamic range of a pixel, that is, each color, and to enhance color reproducibility, as described above. Further, the signal processing unit can acquire a phase difference in the pixel by the divided pixels. An imaging apparatus may use this result for autofocus or the like. In the present disclosure, by adopting the divided pixels 82 in the camera module 3 below the display, removal of artifacts caused by the display unit 2 and the like is also realized.

FIG. 7 is a diagram illustrating another example of the divided pixels 82 in the imaging pixels 80.

For example, as illustrated at the top, the imaging pixel 80 may include 3×3 divided pixels 82, and may include the lens 81 thereabove.

For example, as illustrated second from the top, the imaging pixel 80 may include 4×4 divided pixels 82, and may include the lens 81 thereabove.

Furthermore, for example, as illustrated at the bottom, the imaging pixel 80 may include 3×4 divided pixels 82, and may include the lens 81 thereabove.

In this manner, m×n divided pixels 82 may be provided in as array using integers m and n of two or more. These settings are appropriately set according to the size and number of the imaging pixels 80, or the size of the formation area and volume allowed on the chip, and further the usage.

In the description below, the imaging pixel 80 includes 2×2 divided pixels 82, but it is illustrated as an example, and division by other numerical values is not excluded as described above.

Hereinafter, a case where a bright subject exists as an imaging target and flare due to an influence from. The subject is removed will be described.

Figure 8:
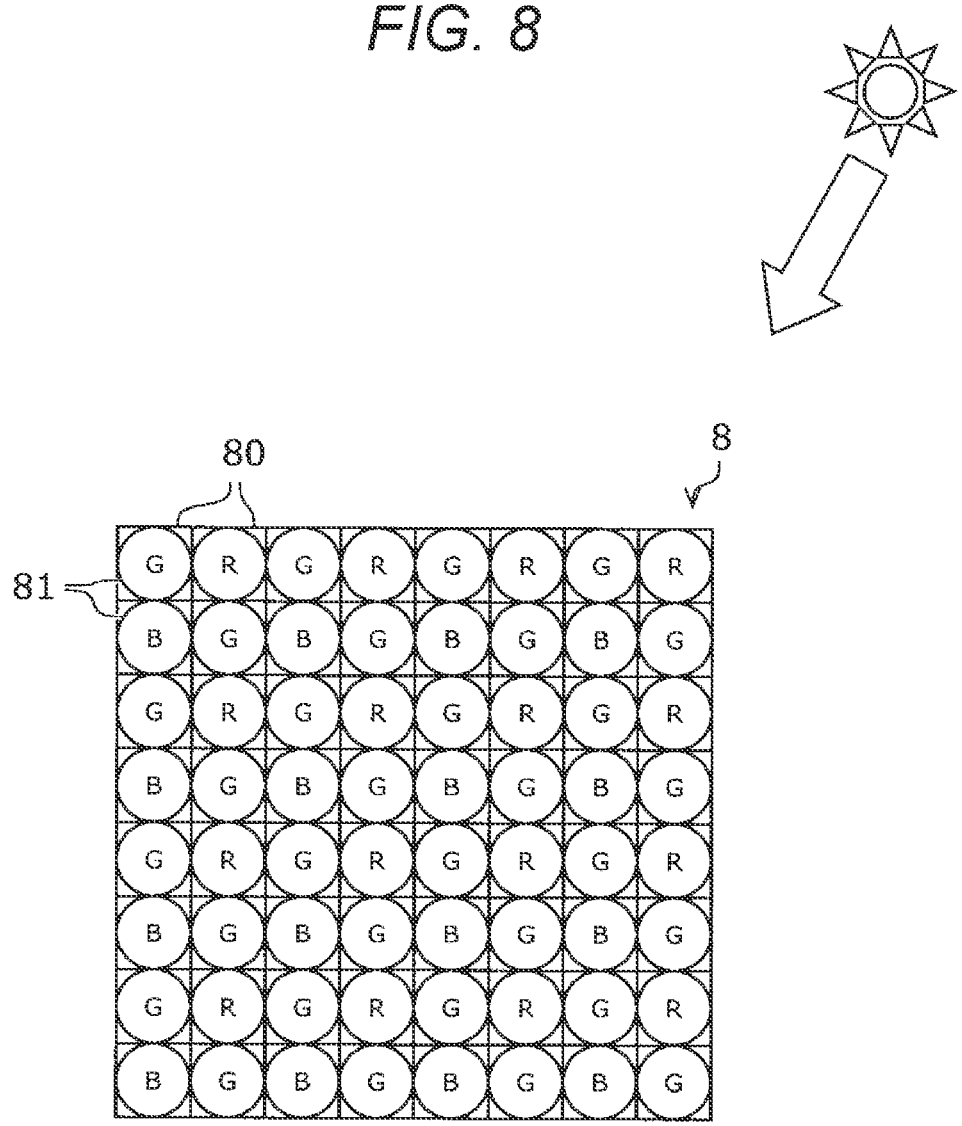
FIG. 8 is a diagram illustrating incidence of light from a bright subject by an imaging unit according to an embodiment.

As illustrated in FIG. 8, a case where light from a bright subject is incident on the imaging unit 8 is considered. In such a case, there is a possibility that flare occurs in some or all of the pixels of the imaging pixels 80 included in the imaging unit 8. In the present embodiment, the occurrence of flare is suppressed by using the divided pixels 82.

Figure 9:
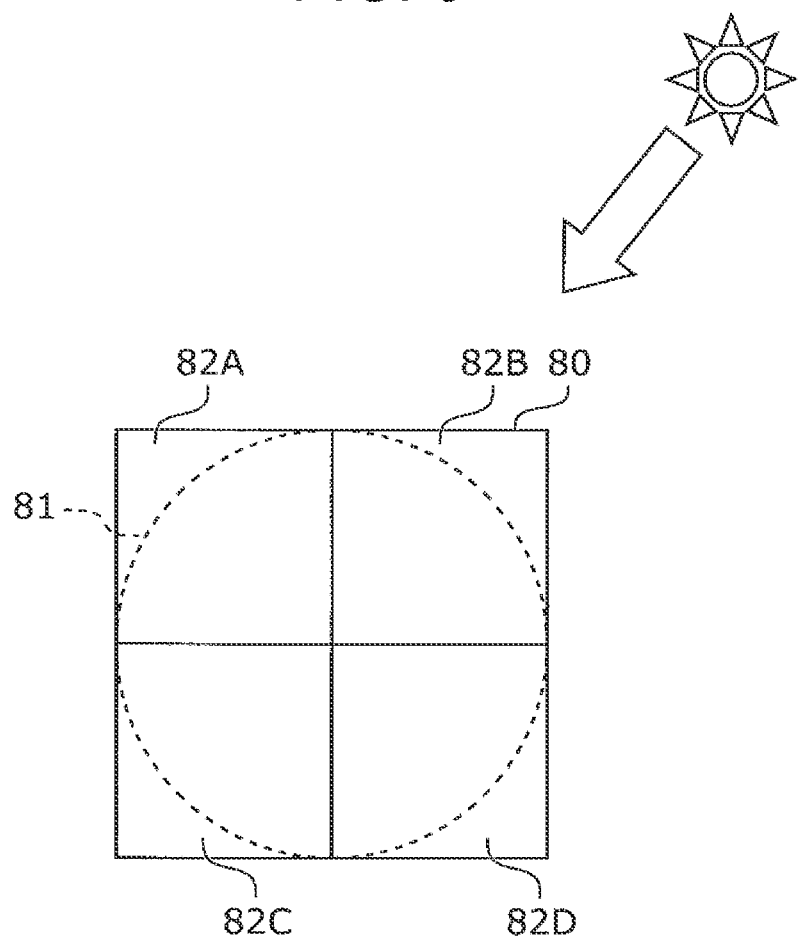
FIG. 9 is a diagram illustrating an imaging pixel on which light from a bright subject is incident according to an embodiment.

FIG. 9 is a diagram illustrating an imaging pixel 80 on which light from a bright subject in FIG. 8 is incident. Note that, although one imaging pixel 80 is illustrated, it is not limited thereto, and similar processing is executed for a plurality of imaging pixels 80 in which flare can occur. Note that the bright subject is, for example, a light source having high luminance and illuminance, an object irradiated with strong light and having strong reflected light, or the like. In addition, the bright subject is, for example, a concept including an object that has higher luminance, illuminance, and the like than the surrounding brightness and can cause flare.

The imaging pixel 80 includes divided pixels 82A, , 82C, and 82D each including a photoelectric conversion element, and the lens 81 formed so as to be shared by the photoelectric conversion elements. It is assumed that light from a bright subject is incident from an upper right direction in the drawing.

In such a case, light is not uniformly emitted from the lens 81 to all the divided pixels 82, but light having strong intensity is emitted in a direction traveling with respect to the light direction. This is due to the characteristics of the lens 81 and the incident angle of light. For example, in the situation of FIG. 9, on the divided pixel 82C, light stronger than that of the other divided pixels 82 is incident. As a result, the pixel value of each divided pixel 82 acquired by the signal acquisition unit 10 is higher in the divided pixel 82C than in the other divided pixels 82A, , and 82D.

On the basis of this phenomenon, the signal processing unit 12 suppresses the influence of flare that may occur in the imaging pixel 80.

As described above, it is possible to acquire a phase difference in the imaging pixel 80 by using the divided pixels 82. The acquisition of the phase difference is determined, for example, by whether or not there is an intensity difference equal to or larger than a predetermined threshold value in the plurality of divided pixels 82 included in one imaging pixel 80. For example, in a case where a pixel value higher than those of other pixels is acquired in the divided pixel 82C, and a difference in pixel value between the divided pixel 82C and the other divided pixels 82A, , and 82D is a predetermined value or more, it is determined that there is a phase difference.

Even in a case where flare occurs, for example, similar determination is made in a case where the pixel value of the divided pixel 82C is higher than the pixel values of the other divided pixels 82 A, , and 82D. However, a threshold value $th_p$ related to phase difference and a threshold value $th_f$ related to flare have a relationship of $th_p < th_f$. The threshold value related to flare is significantly higher than the threshold value related to phase difference, and these threshold values are clearly distinguishable and can be set in advance. For example, the width of the sensitivity difference in a case where focus is not achieved can be acquired in advance. By setting this width to $th_p$ to $th_f$, a predetermined threshold value may be decided. Thus, in a case where the flare is corrected, the signal processing unit 12 can make a determination using the threshold value $th_f$.

Pixel values of the divided images 82A, , 820, and 82D are xA, xB, xC, and xD, respectively. As an example, it is assumed that there is a relationship of HC >xD>xA>xB between them. These are merely indicated as examples, and the technology or the present disclosure is not limited thereto.

[Math. 1]
$$xC - \min\{xA, xB, xC\} = xC - xB > th_f \quad (1)$$

[Math. 2]
$$\frac{xC}{\min\{xA, xB, xD\}} = \frac{xC}{xB} > th_f \quad (2)$$

For example, as in Formula (1), a difference between the pixel value of the divided pixel 82C having the highest pixel value and the lowest pixel value is compared with a threshold value, and when the difference is larger than the threshold value, it may be determined that flare may occur. In some cases, it may be compared with the maximum value max{xA, xB, xC} instead of the minimum value min{xA, xB, xD}. Furthermore, the determination may be made by a ratio as in Formula (2).

As another example, an average may be considered.

[Math. 3]
$$xC - \mathrm{avg}(xA, xB, xD) > th_f \quad (3)$$

[Math. 4]
$$\frac{xC}{\mathrm{avg}(xA, xB, xD)} > th_f \quad (4)$$

Hero , avg ( ) is a function for calculating the average of arguments. Even in the case of considering the average, it can be determined by either the difference or the ratio. Furthermore, in a case of taking an average, in consideration of a case where light is incident perpendicularly to the side of the imaging pixel 80, an average (xA+xB)/2 of two pixel values of two having low pixel values, for example, the divided pixels 82A and 82B among the divided pixels 82A, 82B, and 82C may be taken.

In this manner, whether or not there is a possibility of occurrence of flare in the imaging pixel 80 may be determined by using the predetermined threshold value as the predetermined difference and the predetermined ratio and performing Formulae (1) to (4) or an arithmetic operation similar thereto on the divided pixel 82 having the largest pixel value in the imaging. pixel 80.

In the above description, the threshold value (predetermined difference, predetermined ratio) at which flare occurs is decided on the basis of the threshold value related to the phase difference, but it is not limited thereto. For example, a threshold value for an individual difference of the divided pixels 82 and the influence of noise generated in the divided pixels 82 may be set. In the case of viewing the individual difference, for example, a subject in which flare does not occur with respect to the imaging unit 8 may be imaged, and the signal processing unit 12 may perform ground processing on the basis of an image obtained by imaging the subject.

That is, the signal processing unit 12 may measure the threshold value for each divided pixel 82 in each imaging pixel 80 in advance. It is also possible to similarly measure the threshold value related to noise, and it is also possible to measure the threshold value in which the influence of various noises is reduced by performing the measurement a plurality of times.

In a case where flare can occur as described above, the signal processing unit 12 may calculate the pixel value of the imaging pixel 80 using the divided pixels 82A, 82B, and 82D other than the divided pixel 82C having a high pixel value, and acquire flare-corrected image data. For example, the signal processing unit 12 may set the pixel value of the imaging pixel 80 to 4×xB using a pixel value xB of the divided pixel 82B having the smallest pixel value. As another example, the signal processing unit 12 may set 2×(xA+xB) using the pixel values of the two divided pixels 82A and 82B having low pixel values. The signal processing unit 12 may further use pixel values other than the largest pixel value xC to obtain (4/3)×(xA+xB+xD). As described above, the signal processing unit 12 calculates the pixel value of the imaging pixel 80 using the pixel value that is the output of the divided pixel 82 having a low output value in the imaging pixel 80.

Furthermore, the signal processing unit 12 may execute flare correction using a trained model. For example, the signal processing unit 12 may execute correction using a learned model trained by machine learning on the basis of occurrence of flare in various situations and the state of its correction. In this case, the signal processing unit 12 may input the value of each of the divided pixels 82 to the learned model and acquire the pixel value of the imaging pixel 80. As still another example, the signal processing unit 12 may use a trained model to which pixel values of peripheral imaging pixels 80 of the same color are further input.

For example, the model may be a statistical model. A model may be generated by statistically calculating what kind of arithmetic operation should be used to perform synthesis with respect to various camera modules 3, and the signal processing unit 12 may acquire an image having a small influence of flare by inputting information acquired from the plurality of camera modules 3 to this model.

For example, the model may be a neural network model trained by deep learning. The neural network model may be formed by a multi-layer perception (MLP), a convolutional neural network (CNN), or the like. In this case, a parameter trained in advance by a plurality of teacher data may be stored in the storage unit 20 or the signal processing unit 12, and the signal processing unit 12 may form a neural network model based on the stored parameter. Using the formed trained model, the signal processing unit 12 may acquire an image in which flare is suppressed using data output from the plurality of camera modules 3.

Moreover, in a case where the trained model is used, the electronic equipment 1 may further improve the training accuracy using an imaged image. For example, the training may be executed in the control unit 18 or the like of the electronic equipment 1. As another example, a plurality of pieces of electronic equipment 1 may transmit data to a storage or the like existing in a cloud or the like, execute training in a server or the like, and reflect the retrained parameter to the electronic equipment 1. In this case, only flare information may be transmitted so that privacy information including user's face information is not included. Furthermore, transmission and reception of data from the electronic equipment 1 may be in a state of being selectable by the user by, for example, opt-in or opt-out.

As described above, the signal processing unit 12 may acquire the flare-corrected image by not only linear processing but also nonlinear processing, in particular, an arithmetic operation using various models including the trained model, or the like.

Figure 10:
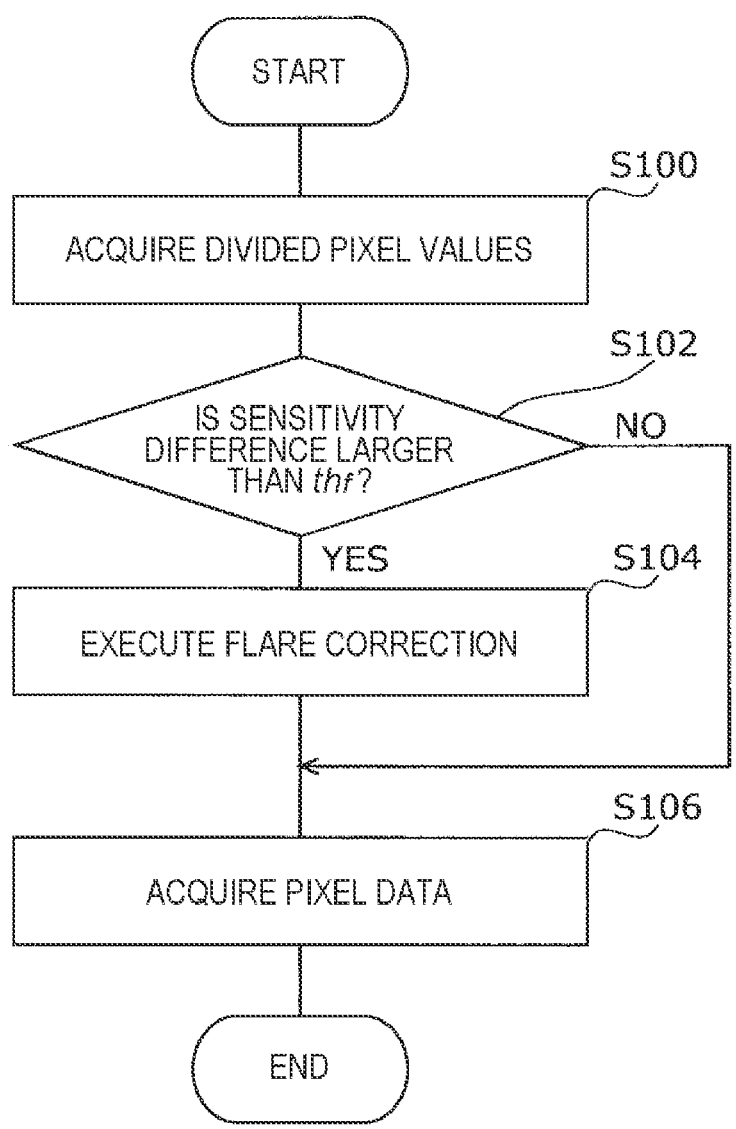
FIG. 10 is a flowchart illustrating correction processing according to an embodiment.

FIG. 10 is a flowchart illustrating a flow of processing according to the present embodiment. In the present flowchart, processing for flare correction is described, and processing such as imaging, data output, and the like is omitted.

First, the signal processing unit 12 acquires the output values of the divided pixels 82 in each imaging pixel 80 via the, signal acquisition unit 10 (S100).

Next, the signal processing unit 12 determines whether or not the sensitivity difference is larger than the sensitivity difference in the phase difference in the output values of the divided pixels 82 belonging to the same imaging pixel 80 (S102). That is, it is determined whether or not the difference in sensitivity between the divided pixel having the largest sensitivity among the divided pixels 82 and the other divided pixels is within a range that is not the phase difference by the threshold value $th_f$ on the basis of Formulae (1), (3), and the like. Note that this processing may be executed not by a difference but by a ratio as in Formulae (2), (4), and the like described above.

In a case where the sensitivity difference is larger than $th_f$ (S102: YES), the signal processing unit 12 executes flare correction using the divided pixels 82. Thereafter, the signal processing unit 12 acquires a flare-corrected value as the pixel value of the imaging pixel 80 (S106).

In a case where the sensitivity difference is equal to or less than $th_f$ (S102: NO), the signal processing unit 12 performs normal pixel value acquisition processing, for example, acquires an addition value of the output values of the respective divided pixels 82 as the pixel value of the imaging pixel 80 (S106).

As described above, according to the present embodiment, it is possible to suppress the occurrence of flare as a pixel due to the incidence of strong light by dividing the pixel with respect to the incidence of the strong light that causes flare. That is, it is possible to concentrate the incidence of strong light that causes flare on some divided pixel, and by correcting the pixel value using other divided pixels, it is possible to acquire the pixel value in which the influence of flare is suppressed.

Second Embodiment

In the first embodiment described above, as an example, a case where one divided pixel 82 having the smallest pixel value in the imaging pixel 80 is used has been described, but in a case where one divided pixel 82 is used in this manner, there is a possibility that the influence of noise is strongly received. In the present embodiment, reducing the influence of this noise will be described.

Figure 11:
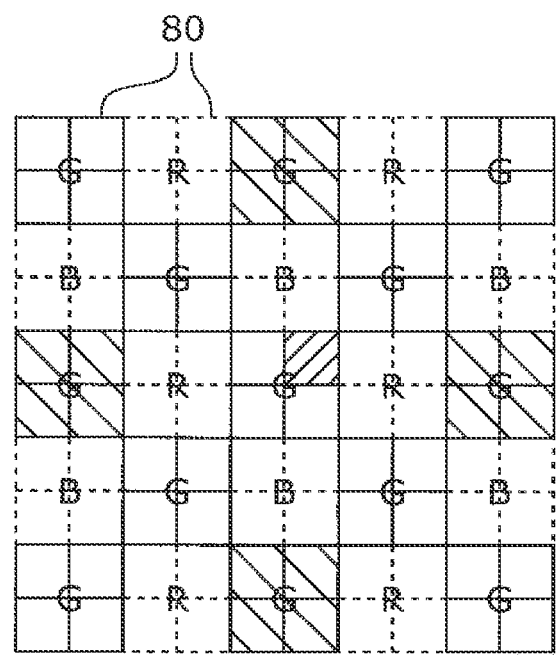
FIG. 11 is a diagram illustrating noise correction according to an embodiment.

FIG. 11 is a diagram for describing a noise correction method according to the present embodiment. For example, in an imaging pixel 80 that acquires the intensity of green at the center, a case will be described in which flare correction is performed using one divided pixel 82B (a divided pixel hatched with diagonal up-right lines) at the upper right.

For example, in a case where pixel values of divided pixels are compared using Formulae (1), (2), and the like, when noise occurs in the divided pixel 82B, there is a case where the influence of the noise satisfies these Formulae. For example, in a case where noise close to black is added to the divided pixel 82B, xC−xB may be a large value, and it may be determined that flare has occurred although flare has not occurred practically.

In order to suppress such an influence or noise, noise determination may be performed on the basis of the formula described below.

[Math. 5]

$$\text{avg}(xA, xC, xD) - xB > th_n \tag{5}$$

Here, $th_n$ is a threshold value for determining noise. A signal processing unit 12 determines whether or not a difference between the average of the pixel values of divided pixels 82A, 82C, and 82D and the pixel value of the divided pixel 82B used for flare correction is larger than this predetermined threshold value. The threshold value $th_n$ for determining noise is, for example, a threshold value satisfying $th_f > th_n > th_p$. Note that the noise determination is not limited to Formula (5), but any noise determination may be used as long as the noise can be appropriately detected. For example, detection may be performed by a ratio as in Formula (2).

In a case where Formula (5) is true, it may be determined that noise has occurred in the divided pixel 82B and the noise correction processing may be executed.

For example, the signal processing unit 12 may perform noise correction on the flare-corrected pixel value on the basis of the pixel value of a peripheral imaging pixel 80 that acquires the same color. For example, the signal processing unit 12 may execute the correction by a method such as bilinear interpolation or bicubic interpolation using pixel values indicated by diagonal up-left lines in FIG. 11. For example, the correction is executed using one pixel value of the same color on the front, back, left, or right, but it is not limited thereto, and information of an imaging pixel 80 in an oblique direction may be used, or information of two or more imaging pixels 80 in the same direction may be used.

Furthermore, in Formula (5), information of another divided pixel 82 is used, but it is not limited thereto. For example, $xB_t$ may be an output value of the divided pixel 82B of the current frame and may be considered on a time axis.

[Math. 6]

$$\text{avg}(xB_{t-2}, xB_{t-1}, xB_{t+1}, xB_{t+2}) - xB_t > th_n \tag{6}$$

As in Formula (6), the noise detection may be executed by a difference from an average value between frames. In particular, in a case where a still image is imaged, the method indicated by Formula (6) can be effectively used. Instead of Formula (6), the determination may be made using a ratio.

When inter-frame information is used, the noise correction may be executed using the inter-frame information. For example, the pixel value of the imaging pixel 80 may be corrected by the formula described below.

[Math. 7]

$$xB_t = \text{avg}(xB_{t-2}, xB_{t-1}, xB_{t+1}, xB_{t+2}) \tag{7}$$

In the above description, information of two preceding and following frames is used in both the noise determination and correction, but it is not limited thereto, and information of one preceding and following frame or three or more preceding and following frames may be used.

Furthermore, the signal processing unit 12 may also execute the noise correction using the trained model described above.

Figure 12:
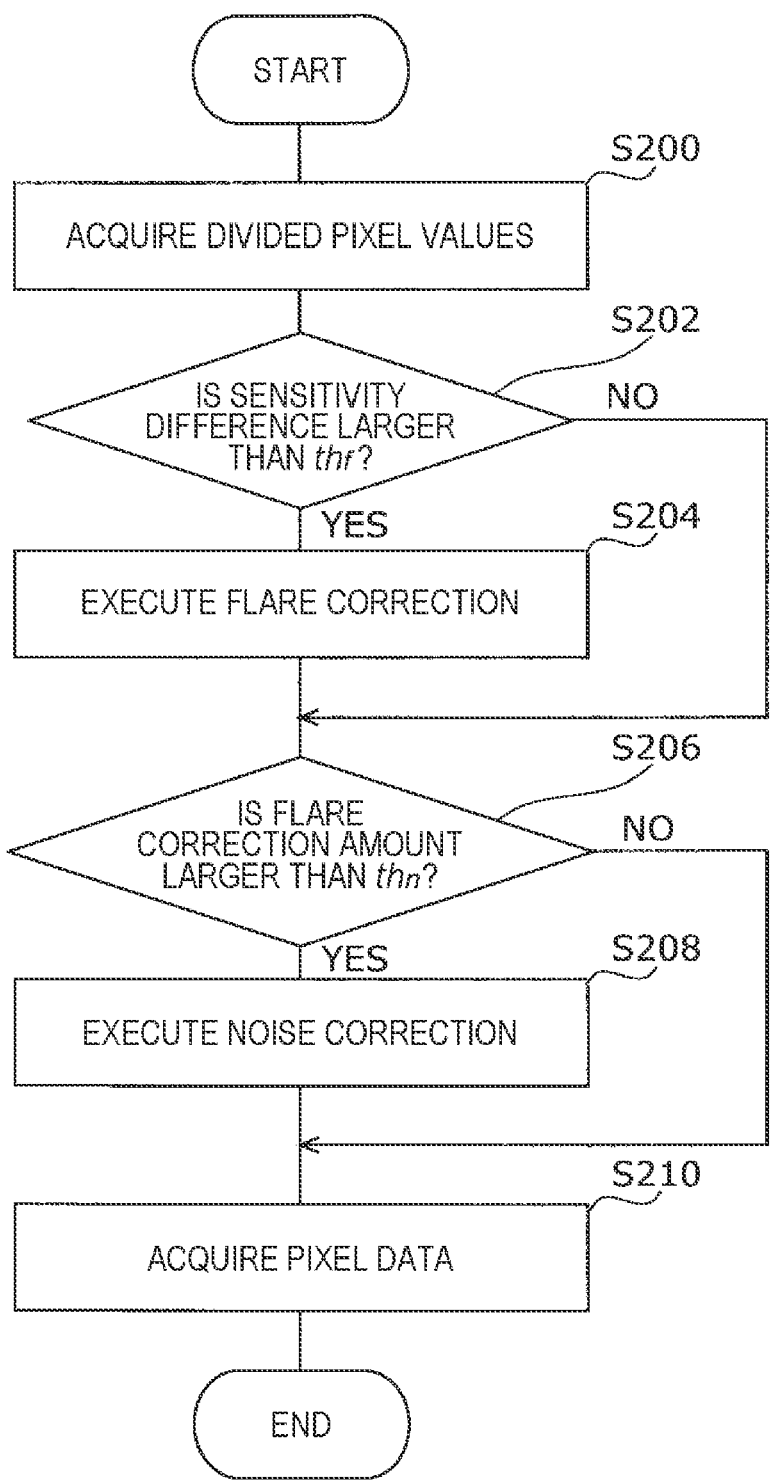
FIG. 12 is a flowchart illustrating correction processing according to an embodiment.

FIG. 12 is a flowchart illustrating processing according to the present embodiment.

Since the processing of S200 to S204 is equivalent to the processing of S100 to S104 in FIG. 10, the description will be omitted.

After the flare correction is executed or in a case where the flare correction is not executed, next, it is determined whether or not the flare correction amount is larger than a threshold value (S206). That is, it is determined whether or not the difference in sensitivity between the divided pixel used for the flare correction among the divided pixels 82 and the other divided pixels is noise by the threshold value $th_n$ on the basis of Formulae (5), (6), and the like.

In a case where the flare correction amount is larger than the threshold value (S206: YES), the noise correction is executed (S208). The signal processing unit 12 executes the noise correction using, for example, the information of the spatial direction or the time direction described above. Note that the correction method is not limited to those described above, but an appropriate method may be used.

After the noise correction or in a case where the flare correction amount is equal to or less than $th_n$ (S206: NO), the signal processing unit 12 acquires image data (S210).

As described above, according to the present embodiment, together with the flare correction, whether or not the output value of the divided pixel used for the flare correction is noise is determined, and in a case where it is determined to be noise, the noise can be corrected and acquired spatially and temporally. In particular, this method is effective in a case where the flare correction is executed using one of the divided pixels, but can be similarly applied to other cases. For example, xB in Formulae (6) and (7) described above may be applied as the flare-corrected pixel value.

Note that the noise threshold value $th_n$ changes depending on the light amount of the entire subject or the acquisition amount and the sensing amount of the signal of the entire imaging unit 8, and thus may change adaptively. That is, the signal processing unit 12 may appropriately change the threshold value $th_n$ on the basis of the surrounding situation and execute the noise detection processing described above.

Third Embodiment

In the first embodiment or the second embodiment, the flare correction is executed for all subjects, but it is not limited thereto. For example, a signal processing unit 12 may detect occurrence of flare and execute the flare correction.

For example, the signal processing unit 12 may detect that a subject having predetermined brightness or more is included and execute the flare correction described above. Furthermore, as another example, the signal processing unit 12 may detect occurrence of flare on the basis of the acquired pixel value and execute the flare correction described above.

Figure 13:
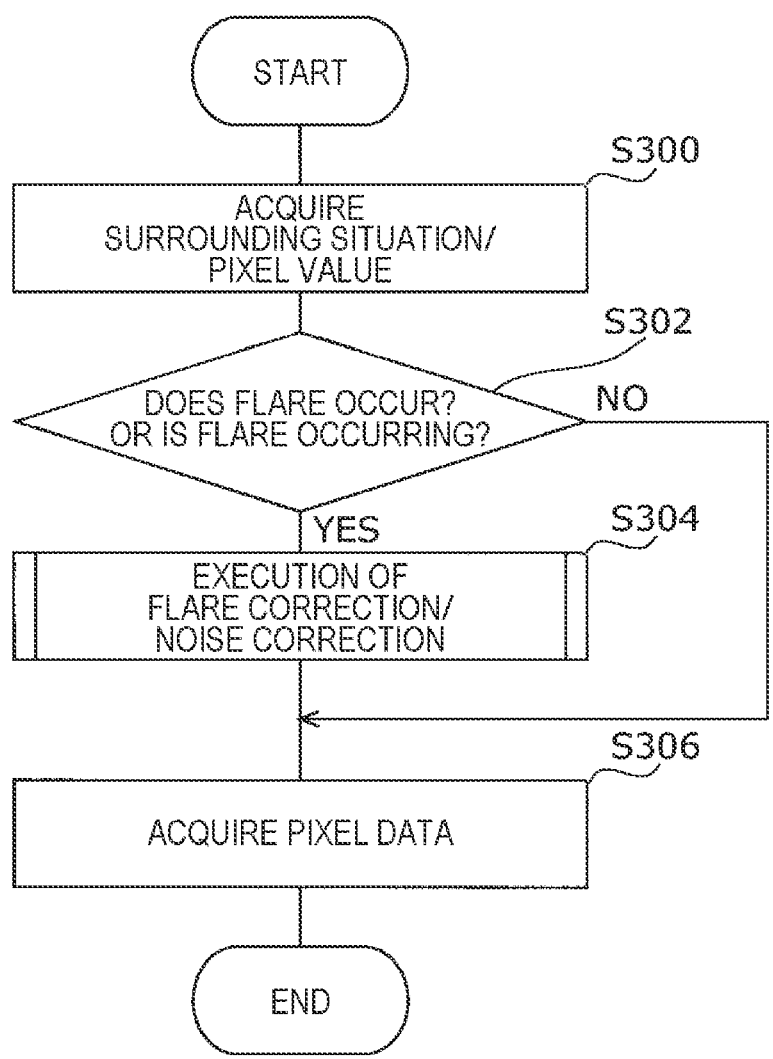
FIG. 13 is a flowchart illustrating correction processing according to an embodiment.

FIG. 13 is a flowchart illustrating processing of flare correction according to the present embodiment.

First, the signal processing unit 12 acquires information regarding the surrounding environment and state, or image data on which correction such as the flare correction is not performed (S300).

Next, the signal processing unit 12 determines whether or not there is a possibility that flare occurs or whether or not flare is occurring on the basis of the information (S302). For example, in a case where an object having luminance and illuminance higher than predetermined threshold values exists as the subject, the signal processing unit 12 determines than there is a possibility of occurrence of flare. Furthermore, it is determined whether or not flare is occurring on the basis of whether or not there is a region of a pixel having a void in the acquired pixel value. These are described as examples, and the determination may be executed on the basis of the possibility of occurrence of flare or a criterion on the basis of which it is possible to determine the occurrence of flare as appropriate.

In a case where it is determined that there is a possibility of occurrence of flare or flare is occurring (S302: YES), the signal processing unit 12 executes the flare correction and the noise correction (S304). This subroutine is, for example, processing equivalent to the processing of S100 to S104 illustrated in FIG. 10 or the processing of S200 to S208 illustrated in FIG. 12.

After performing the flare correction and the noise correction, or in a case where no flare occurs or no flare is occurring (S302: NO), the signal processing unit 12 acquires a pixel value (S306).

As described above, according to the present embodiment, the flare correction is not always executed, and it is possible not to execute the flare correction as necessary. In a case where it is not necessary to perform the flare correction, there is a possibility that the pixel value is deteriorated more than the original pixel value by the correction processing, but in a case where there is no possibility of such flare occurrence or there is no fact of occurrence of flare, it is possible to acquire an image with high reproducibility by avoiding the processing. Furthermore, the operation of the signal processing unit 12 can be reduced.

Fourth Embodiment

In electronic equipment 1 according to the present embodiment, even in a case where flare occurs, any of camera modules 3 is disposed so that the occurrence of flare is weakened.

Figure 14:
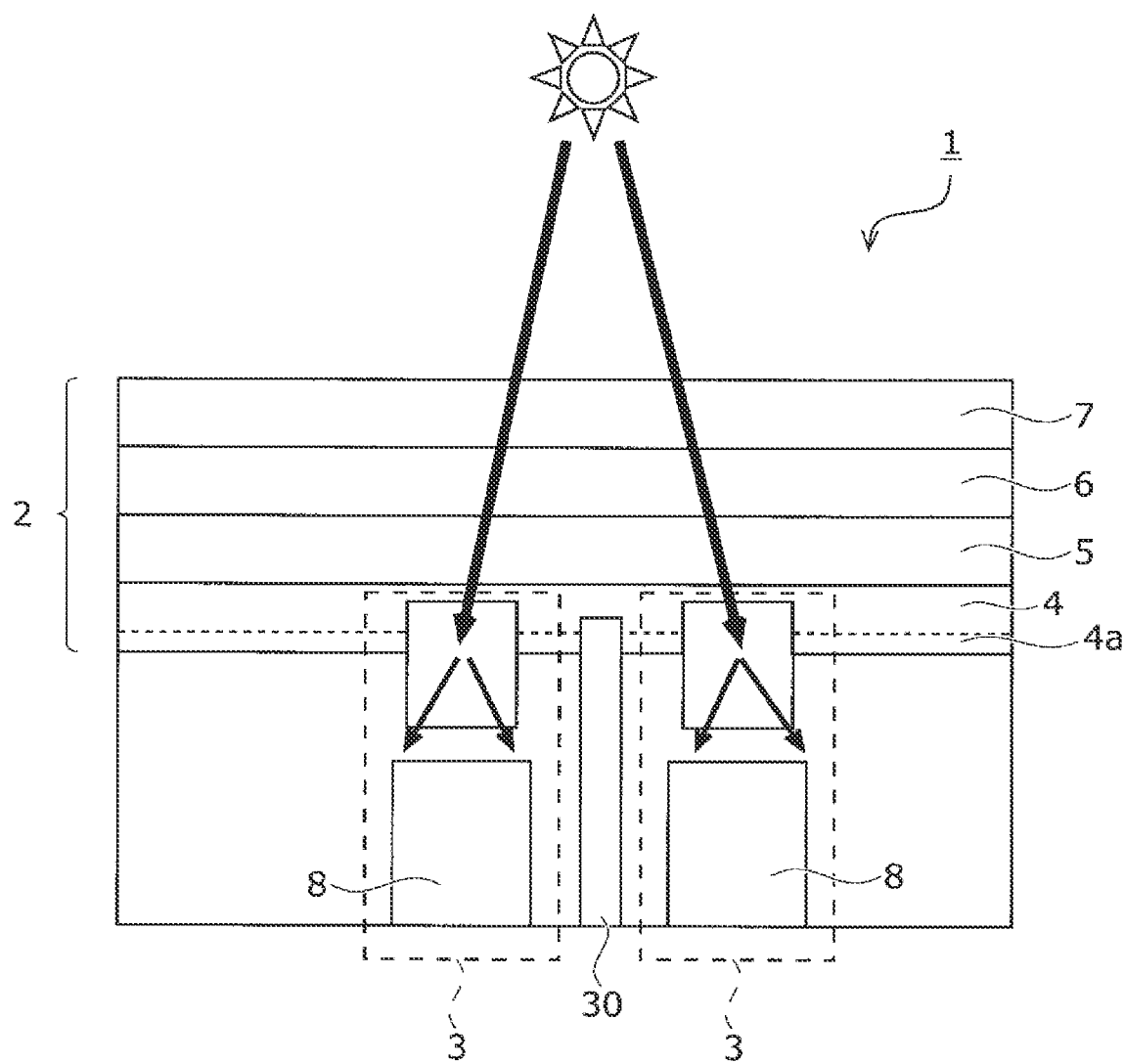
FIG. 14 is a cross-sectional diagram illustrating a disposition example of imaging units according to an embodiment.

FIG. 14 is a diagram illustrating a cross-sectional diagram of the electronic equipment 1 according to the present embodiment. As illustrated in FIG. 14, the electronic equipment 1 includes a plurality of camera modules 3, that is, a plurality of optical systems 9 and a plurality of imaging units 8 in a display panel 4. For example, in a case where flare occurs in a certain imaging pixel 80 in the camera module 3 that acquires an image, attention is drawn to an imaging pixel 80 of the camera module 3 disposed at a different position that acquires the position of the same subject. When the position is changed, the position of the flare in the imaged image is also changed, and therefore there is a high possibility that the flare is not occurring in one imaging pixel 80 even when the flare is occurring in another imaging pixel 80 indicating the position of the same subject.

On the basis of this, the flare correction may be performed on the imaging pixel 80 determined to have flare with reference co the imaging pixel 80 of another imaging unit 8 that has acquired the same position of the subject. More specifically, the flare correction of one imaging pixel 80 may be executed using data of divided pixels 82 of another imaging pixel 80 corresponding to divided pixels 82 of the one imaging pixel 80.

As described above, according to the present embodiment, it is possible to improve the accuracy of the flare correction by providing a plurality of imaging units 8 and using the data of corresponding divided pixels 82 of a corresponding imaging pixel 80.

Note that a light shielding unit 30 may be provided between the camera modules 3 so that flare is not transmitted by the display panel 4 or the like. The light shielding unit 30 may be, for example, a light shielding film including a material having a high light shielding property, or may be an absorption film including a material having a high light absorption rate.

Fifth Embodiment

In each of the embodiments described above, the application to flare correction has been described, but the technology of the present disclosure is not limited to this application. As illustrated in FIG. 1 and the like, various modules such as the display, the touch panel, and the like are mounted above the camera module 3. Therefore, part of the light incident on the imaging unit 8 may be blocked by their wirings and the like. Electronic equipment according to the present embodiment is to correct a pixel value by using divided pixels and signal processing in a case where light is partially blocked as described above.

FIG. 15 is a diagram illustrating the shadows of wirings formed in an imaging unit 8 when light is incident on a display unit 2.

The upper diagram is a diagram schematically illustrating the display unit 2. For example, the display unit 2 includes a plurality of display pixels 40 and a plurality of wirings 41 for driving the display pixels 40. The wiring is, for example, a control line, a signal line, or the like crossing or traversing the display. In a camera module 3 provided below the display, the shadows of the wiring 41 may be a problem.

The lower diagram is a diagram schematically illustrating the imaging unit 8. The solid lines indicate the boundaries of imaging pixels 80, and the dotted lines indicate the boundaries of divided pixels 82. For example, in a case where light is incident, shadows 83 of the wirings 41 are cast on the imaging pixels 80 as illustrated in the lower diagram. When such shadows 83 exist, in a case where each of the imaging pixels 80 includes one photoelectric element without using divided pixels 82, the amount of incident light in the shadow regions decreases, and thus there is a case where the luminance that can be acquired as a whole decreases.

Therefore, by sung the divided pixels 82, this decrease in luminance is suppressed. Even in a case where the divided pixels 82 are used, when there are shadows 83, there is a case where the luminance decreases because the addition value of the divided pixels 82 is used as the pixel value of the imaging pixel 80. For example, in the top left imaging pixel 80 in the lower diagram, the output value from the lower right divided pixel 82 decreases, and the luminance of the imaging pixel 80 as a whole decreases. Furthermore, in the imaging pixel 80 on the right, the output values from the divided pixels 82 in the lower half decrease, and the luminance of the imaging pixel 80 as a whole decreases.

Figure 16:
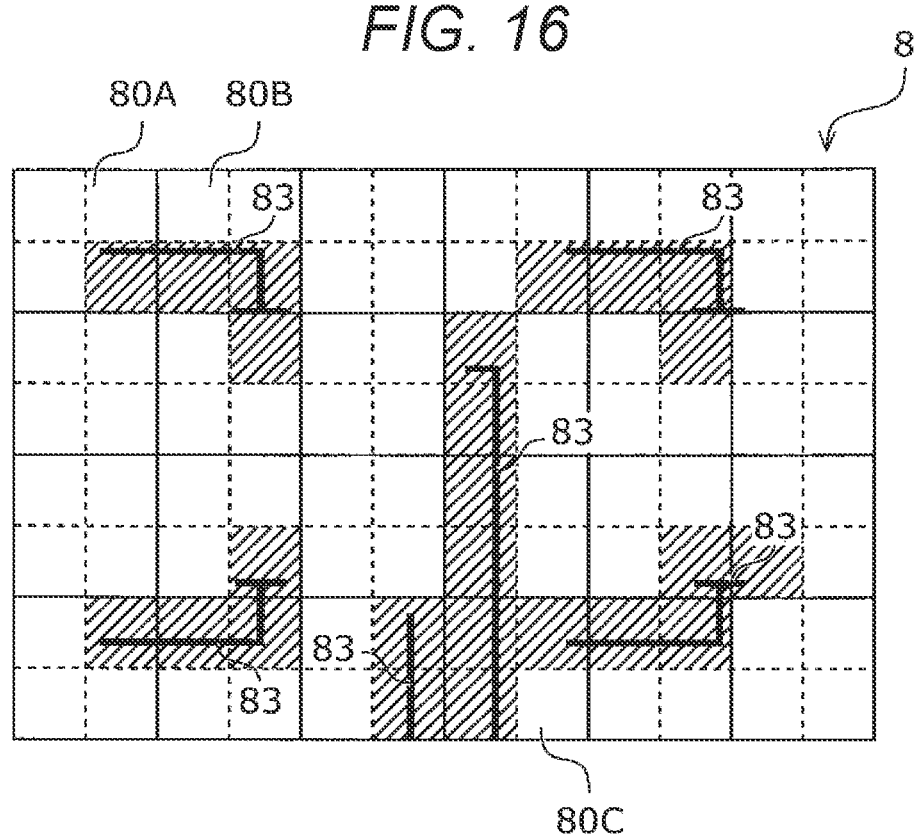
FIG. 16 is a diagram illustrating a state of image deterioration of an imaging unit due to wiring of a display unit.

FIG. 16 is a diagram illustrating the divided pixels 82 in which the luminance, that is, the intensity of incident light decreases due to the shadows 83. The divided pixels 82 indicated by the hatching lines are divided pixels that are subjected to the influence of the shadows 83, and the values of the signals output from these divided pixels 82 decrease, which causes a decrease in the luminance of the imaging pixels 80. In order to avoid this influence, a decrease in the pixel value of the imaging pixels 80 due to the output values from the divided pixels 82 indicated by the hatching lines is calculated by using another divided pixel 82.

For example, in the divided pixels 82 belonging to an imaging pixel 80A, a signal processing unit 12 calculates a luminance value x as x=(4/3)×(xA+xB+xC) without considering a lower right divided pixel 82D.

For example, in the divided pixels 82 belonging to an imaging pixel 80B, the signal processing unit 12 calculates a luminance value x as x=2×(xA+xB) without considering divided pixels 82C and 82D in the lower half.

For example, in the divided pixels 82 belonging to an imaging pixel 80C, the signal processing unit 12 calculates a luminance value x as x=4×xD using a lower right divided pixel 82D.

In summary, the signal processing unit 12 calculates the luminance value x by integrating the gain set for each imaging pixel 80 with the sum of the output values from the available divided pixels 82. The gain is decided by, for example, the number of available divided pixels in the imaging pixels 80. By performing the calculation in this manner, the signal processing unit 12 can acquire the pixel values of the imaging pixels 80 in which the influence of the shadows 83 is suppressed.

Note that, in this case, there is a possibility that the influence of noise increases. In order to avoid this, noise correction similar to that in the second embodiment described above may be executed. Furthermore, noise correction different from that of the second embodiment may be executed. For example, in the imaging pixel 80C, since a pixel value based on the output from one divided pixel 82D is always output, the output value may not be stable. Therefore, for example, in the imaging pixel 80C, the signal processing unit 12 may execute the interpolation processing using a peripheral imaging pixel 80 of the same color unless otherwise specified to reduce the influence of noise.

As described above, according to the present embodiment, the influence of artifacts formed in the imaging unit 8 by the wirings or the like included in the display unit 2 can be reduced by using the region where the artifacts occur, the output values of the available divided pixels 82 of each of the imaging pixels 80, and the gain.

Moreover, in addition to this processing, the flare correction and the noise correction in the above-described embodiments may be executed.

As described above, in the camera module 3 provided below the display, by forming the divided pixels 82 for the imaging pixels 80 in the imaging unit 8, it is possible to realize correction of artifacts caused by flare, the shadow of the display, and the like.

Sixth Embodiment

In the present embodiment, electronic equipment 1 includes a microlens array as an optical system 9 of a camera module 3.

Figure 17:
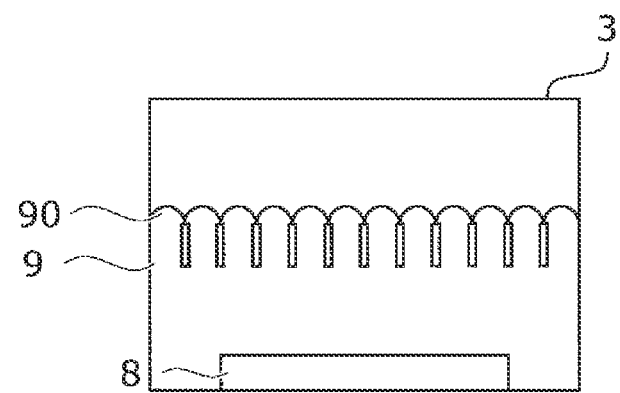
FIG. 17 is a cross-sectional diagram schematically illustrating a camera module according to an embodiment.

FIG. 17 is a diagram illustrating the camera module 3 according to the present embodiment. The optical system 9 of the camera module 3 includes a microlens array 90. The light having passed through the microlens array 90 is appropriately incident on an imaging unit 8, is converted into a signal in the imaging unit 8, and is output.

A signal acquisition unit 10 may reconstruct an image on the basis of the signal output from the imaging unit 8. A signal processing unit 12 acquires a pixel value in which the influence of artifacts according to each of the above-described embodiments is suppressed on the basis of the reconstructed image.

As described above, the optical system 9 of the camera module 3 may include a microlens array in addition to the conjuration including a lens covering the whole. In addition, a Fresnel lens, a zone plate, and the like can also be used.

Hereinafter, some application examples will be described.

Seventh Embodiment

Figure 18:
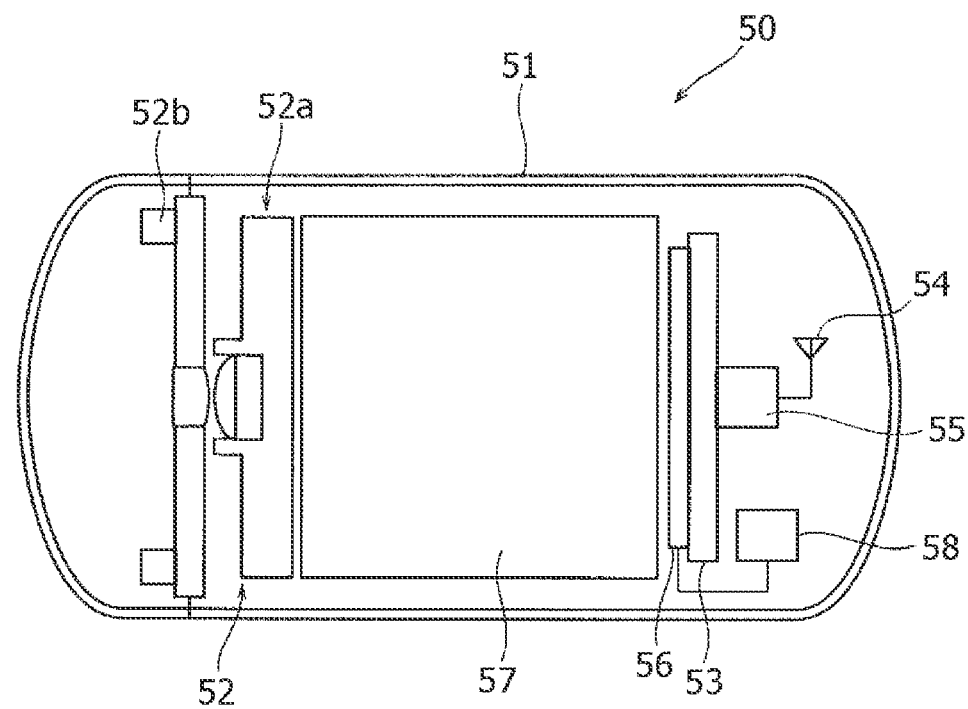
FIG. 18 is a plan diagram is a case where electronic equipment of an embodiment is applied to a capsule endoscope.

Various specific candidates can be conceivable for the electronic equipment 1 having the configuration described in the embodiments described above. For example, FIG. 18 is a plan diagram in a case where the electronic equipment 1 of each embodiment is applied to a capsule endoscope 50. The capsule endoscope 50 of FIG. 18 includes, for example, a camera (ultra-small camera) 52 for imaging an image in a body cavity, memory 53 for recording image data imaged by the camera 52, and a wireless transmitter 55 for transmitting the recorded image data to the outside via an antenna 54 after the capsule endoscope 50 is discharged to the outside of the test subject, in a casing 51 having a hemispherical shape on both end surfaces and a cylindrical shape in a middle portion.

Furthermore, in the casing 51, a CPU 56 and a coil (magnetic force/current conversion coil) 57 are provided. The CPU 56 controls imaging by the camera 52 and data accumulation operation in the memory 53, and controls data transmission from the memory 53 to a data reception apparatus (not illustrated) outside the casing 51 by the wireless transmitter 55. The coil 57 supplies electric power to the camera 52, the memory 53, the wireless transmitter 55, the antenna 54, and light sources 52b to be described later.

Moreover, the casing 51 is provided with a magnetic (reed) switch 58 for detecting when the capsule endoscope 50 is set in the data reception apparatus. The CPU 56 supplies electric power from the coil 57 to the wireless transmitter 55 at a point of time when the reed switch 58 detects setting to the data reception apparatus and data transmission becomes possible.

The camera 52 includes, for example, an imaging element 52a including an optical system 9 for imaging an image in a body cavity, and a plurality of light sources 52b for illuminating the body cavity. Specifically, the camera 52 includes, as the light sources 52b, for example, a CMOS sensor, a CCD, or the like including an LED.

The display unit 2 in the electronic equipment 1 according to the embodiments described above is a concept including a light emitter such as the light sources 52b in FIG. 18. The capsule endoscope 50 of FIG. 18 includes, for example, two light sources 52b, but these light sources 52b can include a display panel 4 having a plurality of light source units or an LED module having a plurality of Leeds. In this case, by disposing an imaging unit 8 of the camera 52 below the display panel 4 or the LED module, restrictions regarding the layout disposition of the camera 52 are reduced, and the capsule endoscope 50 having a smaller size c'an be realized.

Eighth Embodiment

Figure 19:
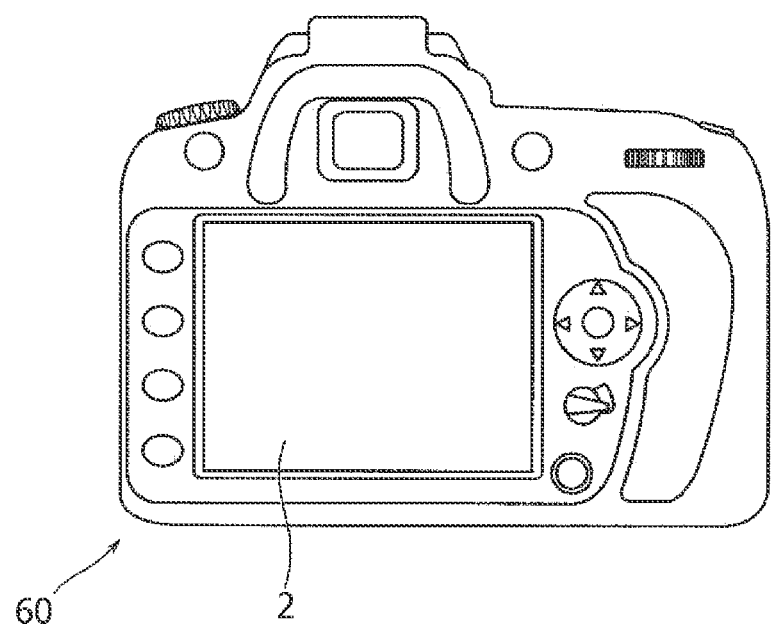
FIG. 19 is a rear diagram of electronic equipment according to an embodiment applied to a digital single-lens reflex camera.

Furthermore, FIG. 19 is a rear diagram of the electronic equipment 1 according to the embodiments described above applied to a digital single-lens reflex camera 60. The digital single-lens reflex camera 60 or a compact camera includes a display unit 2 that displays a preview screen on a back surface opposite to the lens. A camera module 3 may be disposed on the side opposite to the display surface of the display unit 2 so that the face image of an imager can be displayed on a display screen 1a of the display unit 2. In the electronic equipment 1 according to each of the embodiments described above, since the camera module 3 can be disposed in the region overlapping the display unit 2, it is not necessary to provide the camera module 3 in the frame portion of the display unit 2, and the size of the display unit 2 can be increased as much as possible.

Ninth Embodiment

Figure 20:
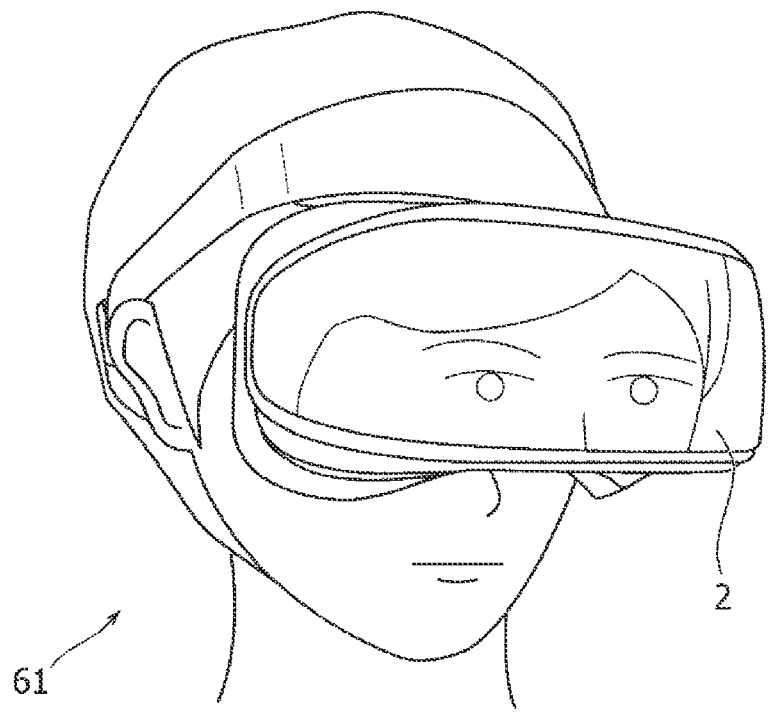
FIG. 20 is a rear diagram of electronic equipment of an embodiment applied to a head mounted display.
Figure 21:
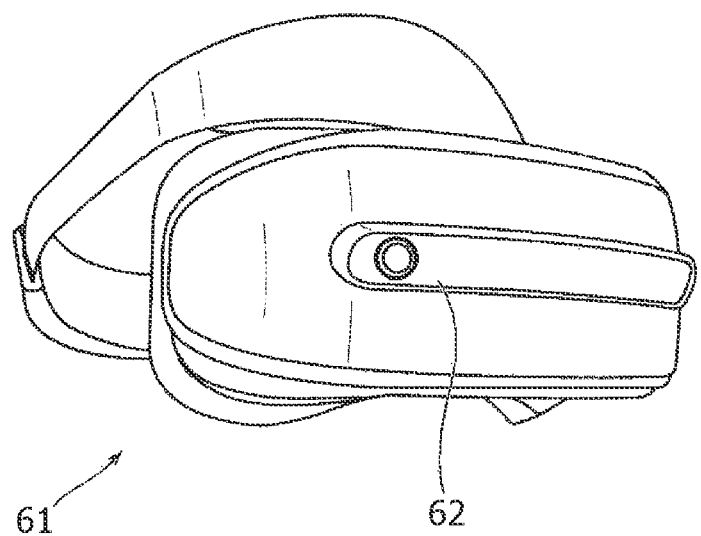
FIG. 21 is a rear diagram of electronic equipment of an embodiment applied to a head mounted display.

FIG. 20 is a plan diagram illustrating an example in which the electronic equipment 1 according to the embodiments described above is applied to a head mounted display (HMD) 61. The HMD 61 of FIG. 20 is used for virtual reality (VR), augmented reality (AR), mixed reality (MR), substitutional reality (SR), or the like. As illustrated in FIG. 21, in the current HMD, a camera 62 is mounted on the outer surface, and there is a problem that a wearer of the HMD can visually recognize a surrounding image, but a surrounding person cannot recognize the expression of the eyes or the face of the wearer of the HMD.

Therefore, in FIG. 20, the display surface of a display unit 2 is provided on the outer surface of the HMD 61, and a camera module 3 is provided on the side opposite to the display surface of the display unit 2. Therefore, the expression of the face of the wearer imaged by the camera module 3 can be displayed on the display surface of the display unit 2, and the person around the wearer can grasp the expression of the face and the movement of the eyes of the wearer in real time.

In the case of FIG. 20, since the camera module 3 is provided on the back surface side of the display unit 2, there is no restriction on the installation location of the camera module 3, and the degree of freedom in the design of the HMD 61 can be increased. Furthermore, since the camera can be disposed at an optimum position, it is possible to prevent problems such as the eye line of the wearer displayed on the display surface cannot be met.

As described above, in the present embodiment, the electronic equipment 1 according to the embodiments described above can be used for various usages, and the utility value can be increased.

Note that the present technology can adopt the configuration described below.

(1)

Electronic equipment including:

a display unit;

an imaging unit that is disposed on a side opposite to a display surface of the display unit; and a signal processing unit, in which the imaging unit includes:

a plurality of on-chip lenses, and a plurality of pixels, and the on-chip lens includes a first on-chip lens, the plurality of pixels includes a first pixel, the first pixel is disposed to overlap the first on-chip lens, the first pixel includes a plurality of photoelectric conversion units, and the signal processing unit processes signals output from the plurality of pixels.

(2)

The electronic equipment according to (1), in which the first pixel acquires information of a predetermined color.

(3)

The electronic equipment according to (2), in which the first pixel includes a color filter.

(4)

The electronic equipment according to (2), in which the first pixel includes an organic photoelectric conversion film in which the photoelectric conversion units each belonging to the same first pixel receive light of the same color.

(5)

The electronic equipment according to any of (1) to (4), in which the first pixel includes m×n (m and n are each an integer of two or more) photoelectric conversion units.

(6)

The electronic equipment according to any of (1) to (5), in which the photoelectric conversion unit includes a photoelectric conversion element (7)

The electronic equipment according to (6), in which the photoelectric conversion element includes a photodiode.

(8)

The electronic equipment according to (2) or (3), in which the imaging unit includes a plurality of the first pixels colored by a Bayer array.

(9)

The electronic equipment according to any of (1) to (8), in which the lens is an on-chip lens, (10)

The electronic equipment according to any of (1) to (9), including an optical system different from the lens between the display unit and the imaging unit.

(11)

The electronic equipment according to (10), in which the optical system is a microlens array.

(12)

The electronic equipment according to any of (1) to (11), in which the signal processing unit adds output values of the photoelectric conversion units belonging to the same first pixel to obtain an output value of the first pixel.

(13)

The electronic equipment according to any of (1) to (12), in which the signal processing unit corrects an output value of the first pixel in a case where output values from the respective photoelectric conversion units exceed a predetermined difference or a predetermined ratio in the photoelectric conversion units formed in the same first pixel.

(14)

The electronic equipment according to (13), in which the predetermined difference or the predetermined ratio is decided on the basis of at least one of an individual difference of the photoelectric conversion units, a phase difference depending on positions of the photoelectric conversion units, or noise generated in the photoelectric conversion units.

(15)

The electronic equipment according to (13) or (14), in which the signal processing unit calculates the output value of the first pixel using a pixel having a low output value of the photoelectric conversion units in the first pixel.

(16)

The electronic equipment according to any of (13) to (15), in which the signal processing unit corrects the output value of the first pixel by using the output value of the first pixel that acquires an output value of the same color around the first pixel.

(17)

The electronic equipment according to any of (13) to (16), in which the signal processing unit performs correction in the first pixel in a case where a subject having predetermined brightness or more is included.

(18)

The electronic equipment according to any of (13) to (17), is which the signal processing unit acquires flare-corrected image data from the acquired signal.

(19)

The electronic equipment according to any of (13) to (18), in which the signal processing unit determines that flare is occurring in as imaged image.

(20)

The electronic equipment according to (19), in which a plurality of the imaging units exists at different positions on the display surface, and the signal processing unit performs correction for pixels belonging to the region determined to have flare on the basis of outputs of corresponding pixel regions of the imaging units existing at the different positions.

(21)

The electronic equipment according to (19) or (20), in which the signal processing unit performs correction for pixels belonging to the region determined to have flare on the basis of a learned model.

(22)

The electronic equipment according to any of (13) to (21), in which for the acquired first pixel, the signal processing unit performs correction on the basis of at least one of an average value of outputs of the plurality of photoelectric conversion units belonging to the first pixel, a value having low sensitivity among outputs of the photoelectric conversion units belonging to the first pixel, or a value obtained by inputting outputs of the plurality of photoelectric conversion units belonging to the first pixel to a learned model.

(23)

The electronic equipment according to (10), in which the signal processing unit performs correction using the photoelectric conversion units for the first pixel on the basis of a circuit of the display unit or the optical system.

(24)

The electronic equipment according to (23), in which in a case where the correction based on the circuit of the display unit or the optical system is performed for the first pixel, the signal processing unit performs noise removal different from noise removal of another first pixel.

(25)

The electronic equipment according to any of (1) to (24), in which the display unit is provided on both surfaces of a device.

Aspects of the present disclosure are not limited to the above-described individual embodiments, but include various modifications that can be conceived by those skilled in the art, and the effects of the present disclosure are not limited to the above-described contents. That is, various additions, changes, and partial deletions can be made without departing from the conceptual idea and spirit of the present disclosure derived from the contents specified in the claims and equivalents thereof.

REFERENCE SIGNS LIST

1 Electronic equipment
1a Display screen
1b Bezel
2 Display unit
3 Camera module
4 Display panel
4a Substrate
40 Display pixel
41 Wiring
5 Circularly polarizing plate
6 Touch panel
7 Cover glass
8 Imaging unit
80 Imaging pixel
81 Lens
82 Divided pixel
83 Shadow
9 Optical system
10 Signal acquisition unit
12 Signal processing unit
14 Post-processing unit
16 Output unit
18 Control unit
20 Storage unit

The invention claimed is:

1. Electronic equipment comprising:
a display;
an imager that is disposed on a side opposite to a display surface of the display; and
a signal processor, wherein
the imager includes a plurality of on-chip lenses and a plurality of pixels,
the on-chip lens includes a first on-chip lens,
the plurality of pixels includes a first pixel, the first pixel being disposed to overlap the first on-chip lens,
the first pixel includes a plurality of photoelectric conversion units,
the signal processor processes signals output from the plurality of pixels, and
the signal processor corrects an output value of the first pixel in a case where output values from the photoelectric conversion units of the first pixel exceed a predetermined difference or a predetermined ratio.

2. The electronic equipment according to claim 1, wherein the first pixel acquires information of predetermined color.

3. The electronic equipment according to claim 2, wherein the first pixel includes a color filter or an organic photoelectric conversion film in which the photoelectric conversion units each belonging to the same first pixel receive light of a same color.

4. The electronic equipment according to claim 2, wherein the imager includes a plurality of the first pixels colored by a Bayer array.

5. The electronic equipment according to claim 1, wherein the first pixel includes m×n (m and n are each an integer of two or more) photoelectric conversion units.

6. The electronic equipment according to claim 1, wherein the photoelectric conversion units respectively includes a photodiode.

7. The electronic equipment according to claim 1, wherein the signal processor adds the output values of the photoelectric conversion units of the first pixel to obtain an output value of the first pixel.

8. The electronic equipment according to claim 1, wherein the predetermined difference or the predetermined ratio is decided on a basis of at least one of an individual difference of the photoelectric conversion units, a phase difference depending on positions of the photoelectric conversion units, or noise generated in the photoelectric conversion units.

9. The electronic equipment according to claim 1, wherein the signal processor calculates the output value of the first pixel using a pixel having a low output value of the photoelectric conversion units in the first pixel.

10. The electronic equipment according to claim 1, wherein the signal processor corrects the output value of the first pixel by using the output value of the first pixel that acquires an output value of a same color around the first pixel.

11. The electronic equipment according to claim 1, wherein the signal processor performs correction in the first pixel in a case where a subject having predetermined brightness or more is included.

12. The electronic equipment according to claim 1, wherein the signal processor acquires flare-corrected image data from the acquired signal.

13. The electronic equipment according to claim 1, wherein the signal processor determines that flare is occurring in an imaged image and performs flare correction in a case where it is determined that flare is occurring.

14. The electronic equipment according to claim 1, wherein for the acquired first pixel, the signal processor performs correction on a basis of at least one of an average value of the output signals of the plurality of photoelectric conversion units of the first pixel, a value having low sensitivity among the output signals of the photoelectric conversion units of the first pixel, or a value obtained by inputting the output signals of the plurality of photoelectric conversion units of the first pixel to a learned model.

15. The electronic equipment according to claim 1, wherein the signal processor performs correction using the photoelectric conversion units for the first pixel on a basis of a circuit of the display or an optical system provided between the display the imager.

16. The electronic equipment according to claim 15, wherein in a case where the correction based on the circuit of the display or the optical system is performed for the first pixel, the signal processor performs noise removal different from noise removal of another of the first pixels.

17. The electronic equipment according to claim 1, wherein the display is provided on first and second surfaces of a device.

* * * * *